(12) United States Patent
Matsuda

(10) Patent No.: US 6,415,504 B1
(45) Date of Patent: *Jul. 9, 2002

(54) ALTERING METHOD OF CIRCUIT PATTERN OF PRINTED-CIRCUIT BOARD

(75) Inventor: Shinji Matsuda, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/711,656

(22) Filed: Sep. 9, 1996

(30) Foreign Application Priority Data

Feb. 28, 1996 (JP) ................................. 8-041927

(51) Int. Cl.[7] ................................. H05K 3/02

(52) U.S. Cl. ................. 29/846; 29/850; 174/251; 427/96; 439/47; 439/75; 439/511

(58) Field of Search ............... 29/847, 850, 852, 29/846; 174/251; 427/96; 439/47, 75, 511

(56) References Cited

U.S. PATENT DOCUMENTS

| 3,128,332 A | * | 4/1964 | Burkig et al. | |
|---|---|---|---|---|
| 3,142,112 A | * | 7/1964 | Burkig et al. | |
| 4,642,160 A | * | 2/1987 | Burgess | 29/852 X |
| 4,679,321 A | * | 7/1987 | Plonski | |
| 4,764,644 A | * | 8/1988 | Reisman et al. | |
| 4,859,806 A | * | 8/1989 | Smith | 29/847 X |
| 4,935,589 A | * | 6/1990 | Boggs | 29/830 X |
| 5,347,712 A | * | 9/1994 | Yasuda et al. | 29/852 |

FOREIGN PATENT DOCUMENTS

| JP | 52-119191 | 6/1977 |
|---|---|---|
| JP | 5-343832 | 12/1993 |

* cited by examiner

*Primary Examiner*—Carl J. Arbes
(74) *Attorney, Agent, or Firm*—Arent Fox Kintner Plotkin & Kahn, PLLC

(57) ABSTRACT

A method for altering a circuit pattern of a printed-circuit board includes the steps of removing a portion of the printed-circuit board so that the circuit pattern inside the printed-circuit board is exposed, and connecting an exposed portion of the circuit pattern to another portion of the printed-circuit board by a conductive body so that a circuit path is formed between the exposed portion of the circuit pattern and the other portion of the printed-circuit board.

10 Claims, 22 Drawing Sheets

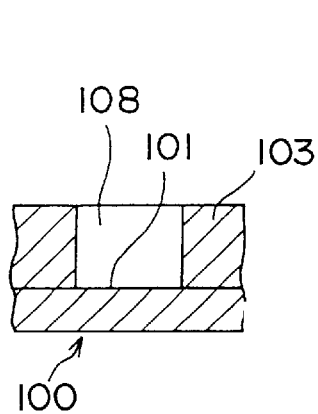 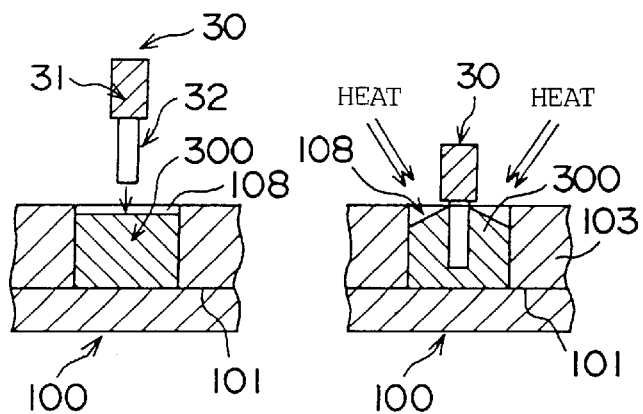
FIG. 4A  FIG. 4B  FIG. 4C
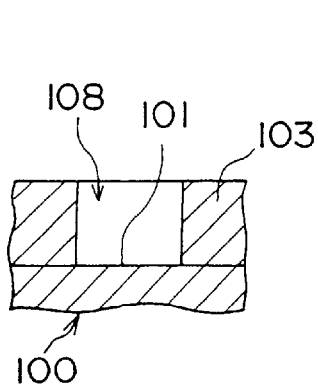 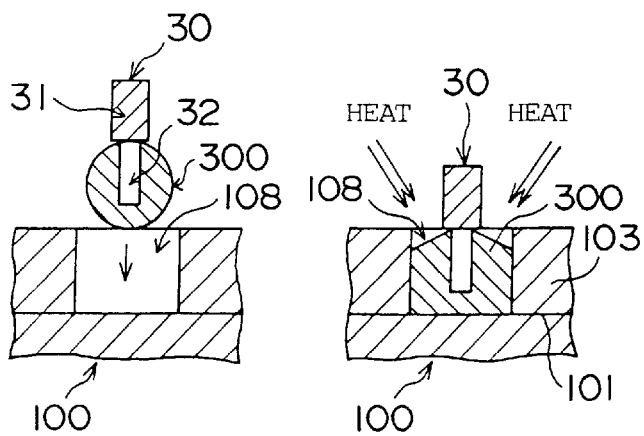
FIG. 5A  FIG. 5B  FIG. 5C

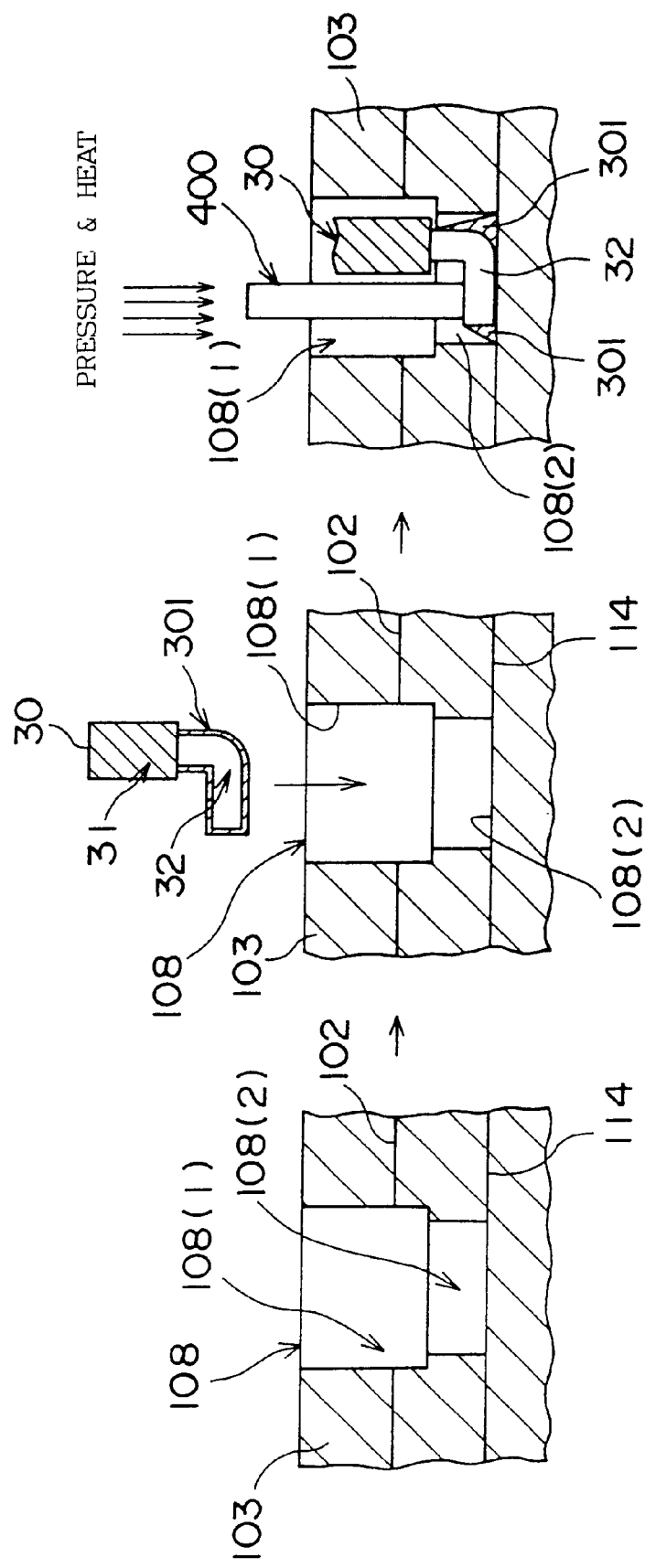

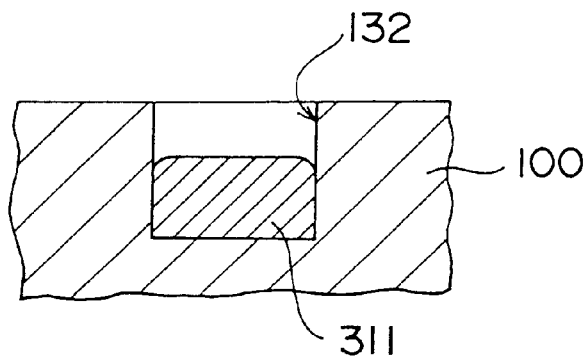
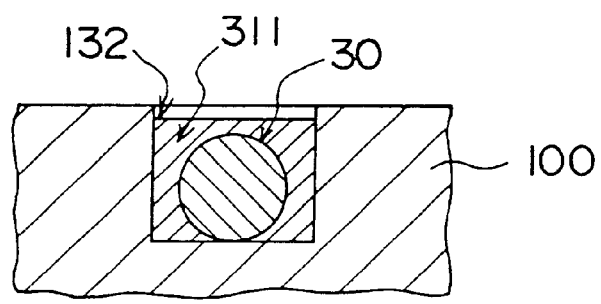
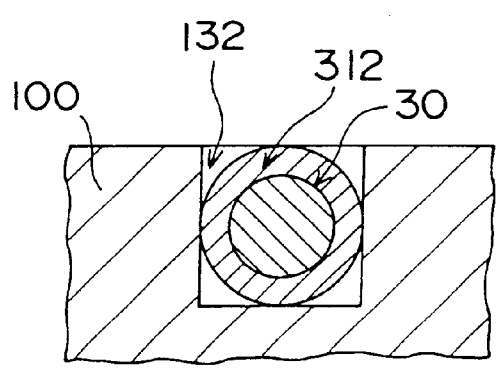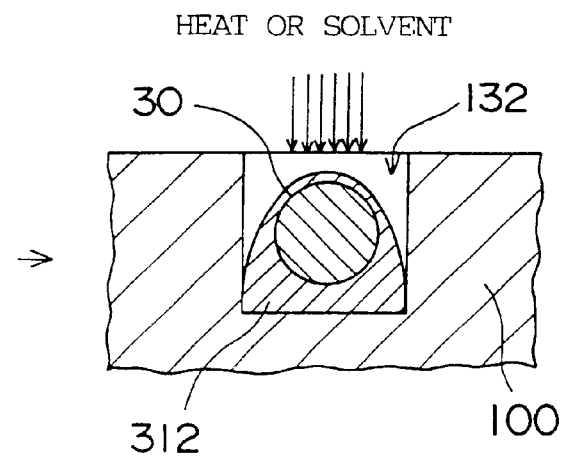

ALTERING METHOD OF CIRCUIT PATTERN OF PRINTED-CIRCUIT BOARD

BACKGROUND OF THE INVENTION (1) Field of the Invention

The present invention generally relates to methods for altering and cutting circuit patterns of a printed-circuit board and a printed-circuit board, and more particularly to an altering method for altering a circuit pattern on an inner layer of a multi-layer printed-circuit board (an organic printed-circuit board, such as a glass-epoxy board and a polyimide board, and an inorganic printed-circuit board, such as a ceramic board), a cutting method for cutting a circuit pattern of a printed-circuit board, applicable to the altering method, and a printed-circuit board having an altered circuit pattern.

(2) Description of the Related Art

Conventionally, in a printed-circuit board in which a circuit pattern corresponding to electronic circuits for electronic equipment is formed, spare circuit lines, spare connecting pads, spare via-holes used to electrically connecting circuit patterns on stacked layers and the like are often additionally formed for alteration of the circuit pattern based on design changes of the electronic circuits. When the design changes of the electronic circuits have been made, a new circuit pattern can be formed using the spare circuit lines, the spare connecting pads and the spare via-holes. In addition, the circuit pattern corresponding to the original electronic circuits is cut so as to be altered into a circuit pattern corresponding to the design changed electronic circuits.

Due to the use of such printed-circuit boards, even if the design changes of the electronic circuits are made, it is not necessary to make a new printed-circuit board corresponding to the design changed electronic circuits. Thus, the printed-circuit board having the circuit pattern corresponding to the design changed circuits can be rapidly prepared.

On the other hand, in recent years, printed-circuit boards have been miniaturized by increasing the density of the circuit pattern. Thus, since forming of the spare circuit lines, the spare connecting pads and the spare via-holes prevents the density of the circuit pattern from being increased, there is a tendency to abandon formation of these spare elements.

However, in a case where a printed-circuit board from which the spare elements, such as the spare circuit lines, the spare connecting pads and the spare via-holes are omitted is used, it is difficult to alter a circuit pattern on an inner layer of the printed-circuit board when the design changes of the electronic circuits have been made.

In addition, in a case where the circuit pattern on the inner layer of the printed-circuit board is altered, the circuit pattern is generally cut. In this case, the circuit pattern on the inner layer of the printed-circuit board has to be accurately cut with consideration to a position of an adjacent circuit pattern. In particular, in a case where the circuit is cut, in a non-contacting manner, using a high energy beam, such as an electron beam or a laser beam, metal powder generated by the abrasion of material of the circuit pattern causes insulation defects. The insulation defects must be prevented.

SUMMARY OF THE INVENTION

Accordingly, a general object of the present invention is to provide methods for altering and cutting a circuit pattern of a printed-circuit board and a printed-circuit board having an altered circuit pattern, in which the disadvantages of the aforementioned prior art are eliminated.

A first specific object of the present invention is to provide an altering method which can easily alter a circuit pattern on an inner layer of a printed-circuit board.

The above objects of the present invention are achieved by a method for altering a circuit pattern of a printed-circuit board, comprising the steps of: (a) removing a portion of the printed-circuit board so that the circuit pattern inside the printed-circuit board is exposed; and (b) connecting an exposed portion of the circuit pattern obtained in step (a) to another portion of the printed-circuit board by a conductive body so that a circuit path is formed between the exposed portion of the circuit pattern and the another portion of the printed-circuit board.

According to the altering method of the present invention, a new circuit path which connects the circuit pattern to another portion of the printed-circuit board can be formed without spare circuit lines, spare lands and the like.

A second specific object of the present invention is to provide a cutting method by which a circuit pattern can be accurately cut in consideration of a position of another circuit pattern.

The above object of the present invention is achieved by the following methods:

A method for cutting a circuit pattern located under a sheet-shaped circuit pattern inside a printed-circuit board comprising the steps of (a) forming a first cutting hole which passes through the sheet-shaped circuit pattern, the first cutting hole having a first aperture area, and (b) forming a second cutting hole which expands from a bottom surface of the first cutting hole and passes through the circuit pattern so that the circuit pattern is cut, the second cutting hole having a second aperture area narrower than the first aperture area;

A method for cutting a circuit pattern inside a printed-circuit board comprising the steps of (a) removing a portion with a predetermined depth of the printed-circuit board, and (b) expanding the portion which is removed in a direction parallel to the surface of the printed-circuit board, so that the circuit pattern is cut while the portion which is removed is being expanded;

A method for cutting a circuit pattern inside a printed-circuit board comprising the steps of (a) adjusting a mask of a beam so that a projection area of the beam projected onto a surface of the printed-circuit board has a predetermined length in a direction parallel to a width direction of the circuit pattern, and (b) projecting the beam onto the printed-circuit board so that a hole is formed in the printed-circuit board, whereby the circuit pattern is cut by the beam;

A method for cutting a circuit pattern inside a printed-circuit board comprising the steps of (a) adjusting a mask of a beam having a predetermined energy so that a projection area of the beam is formed on a surface of the printed-circuit board, the projection area being decided based on a narrowing ratio of the beam and a working area of the beam projected onto a surface of the circuit pattern to be cut, the narrowing ratio of the beam being a degree of narrowing of an area, to be worked by the beam having the predetermined energy, in materials on and over a surface of the circuit pattern, and (b) projecting the beam in which the mask thereof is adjusted on the printed circuit board so that a hole is formed in the printed-circuit board, whereby the circuit pattern is cut by the beam;

A method for cutting a circuit pattern inside a printed-circuit board comprising the steps of (a) removing a portion of the printed-circuit board by projection of a beam focused on a focal point, and (b) moving the focal point on which the beam is focused with moving of a working area of the beam inside the printed-circuit board caused by removal of the portion of the printed-circuit board, whereby the circuit pattern is cut by the beam;

A method for cutting a circuit pattern inside a printed-circuit board comprising the steps of (a) projecting a beam in which a mask thereof is adjusted so that a first projection area of the beam corresponds to an area covering the circuit pattern, a first portion at a first side of the circuit pattern and a second portion at a second side of the circuit pattern, a hole being formed by the beam until a predetermined depth is obtained, (b) projecting the beam in which the mask thereof is adjusted so that a second projection area of the beam corresponds to an area covering the circuit pattern and the first portion, and (c) projecting the beam in which the mask thereof is adjusted so that a third projection area of the beam corresponds to an area covering the circuit pattern and the second portion, wherein after the step (a) is completed, the step (b) and the step (c) are alternately repeated at predetermined intervals until the circuit pattern is cut by the beam; and A method for cutting a circuit pattern inside a printed-circuit board comprising the step of projecting a beam on the printed-circuit board while a mask thereof is being adjusted so that a projection area of the beam is narrowed, a hole being formed in the printed-circuit board by projection of the beam, so that the circuit pattern is cut by the beam.

According to the cutting method of the present invention, the circuit pattern can be accurately cut while taking into consideration of a position of another circuit pattern such as the sheet-shaped circuit pattern.

A third specific object of the present invention is to provide a printed-circuit board having an altered circuit pattern.

The above object of the present invention is achieved by a printed-circuit board comprising: a circuit device mounted on the printed circuit board; and a conductive body which is in a groove formed in the printed-circuit board so as to pass under the circuit device, the groove corresponding to a circuit path.

According to the printed-circuit board of the present invention, the printed-circuit board in which a circuit pattern has been altered can be obtained.

BRIEF DESCRIPTION OF THE DRAWINGS

Other objects, features and advantages of the present invention will be apparent from the following description when read in conjunction with the accompanying drawings, in which:

FIGS. 4A, 4B and 4C are diagrams illustrating a process for connecting a wire to the exposed circuit pattern;

FIGS. 5A, 5B and 5C are diagrams illustrating another process for connecting a wire to the exposed circuit pattern;

FIGS. 10A, 10B and 10C are diagrams illustrating a process for connecting a wire to the circuit pattern exposed through the hole as shown in FIGS. 8, 9A and 9B;

FIGS. 34A and 34B are diagrams illustrating a method for fixing the wire in the groove shown in FIG. 32 (1st); and FIGS. 35A and 35B are diagrams illustrating a method for fixing the wire in the groove shown in FIG. 32 (2nd).

DETAILED DESCRIPTION OF THE PREFERRED EMBODIMENTS

A description will be given of an embodiment of the present invention.

Figure 1A:
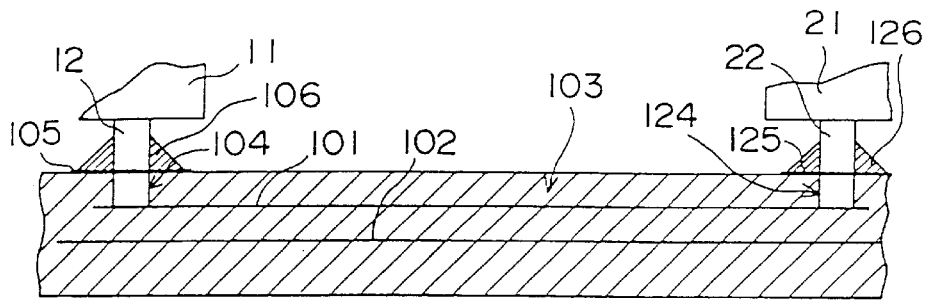
FIGS. 1A, 1B, 1C and 1D are diagrams illustrating a process for altering a circuit pattern of a printed-circuit board according to an embodiment of the present invention.

A printed-circuit board which should be altered is formed as shown in FIG. 1A. Referring to FIG. 1A, a first circuit pattern 101 which is line-shaped and a second circuit pattern 102 which is sheet-shaped are formed inside a printed-circuit board 100 (made of, for example, glass-epoxy resin). The second circuit pattern 102 is located under the first circuit pattern 101. The first circuit pattern 101 is used for transmission of signals, and the second circuit pattern 102 is used for a power line or a ground line. Lands 105 and 125 are formed on an insulating body 103 (e.g., insulating material or resist) covering the first circuit pattern 101. Via-holes 104 and 124 respectively extending from the lands 105 and 125 to the first circuit pattern 101 are formed in the printed-circuit board 100. The via-holes 104 and 124 are respectively filled with pins 12 and 22 of electronic components 11 and 21 (e.g., LSI devices). The pins 12 and 22 electrically contact the first circuit pattern 101, and are fixed onto the printed-circuit board 100 by solder lumps 106 and 126 on the lands 105 and 125.

Figure 1B:
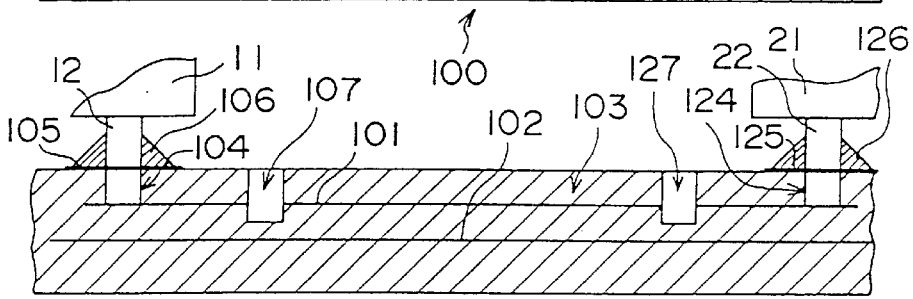
Figure 1C:
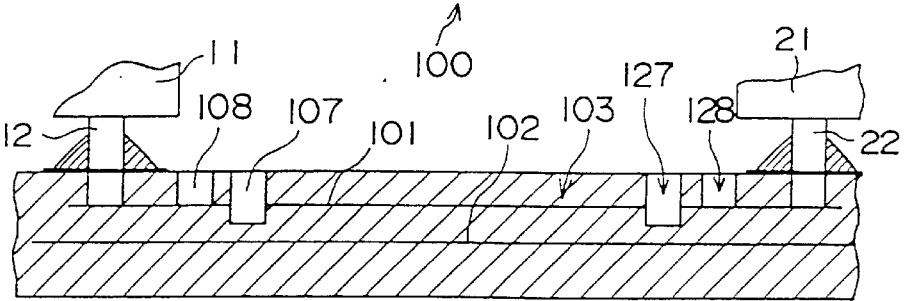
Figure 1D:
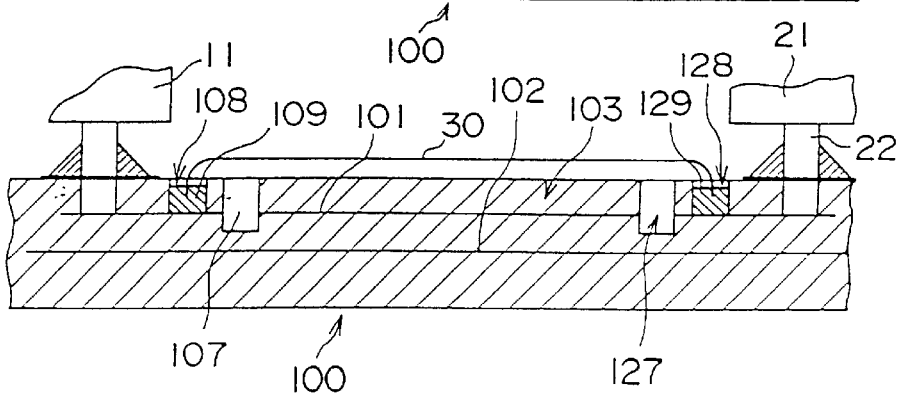

The first circuit pattern 101 located over the second circuit pattern 102 inside the printed-circuit board 100 as described above is altered in accordance with a procedure as shown in FIGS. 1B, 1C and 1D.

First, as shown in FIG. 1B, holes 107 and 127 are respectively formed at positions adjacent to the lands 105 and 125 so as to pass through the first circuit pattern 101. As a result, the first circuit pattern 101 is cut, so that the electrical connection between the pins 12 and 22 of the electronic components 11 and 21 through the first circuit pattern 101 is cut off. The first circuit pattern 101 may be mechanically cut using a drill, and may be cut, in a non-contacting manner, using a high energy beam such as a laser beam or an electron beam. The detailed description of cutting of the circuit pattern will be given later.

After the first circuit pattern 101 is cut as described above, the insulating body 103 is partially removed so that pattern exposure holes 108 and 128 are formed. Parts of the first circuit pattern 101 which electrically contact the pins 12 and 22 of the electronic components 11 and 22 are partially exposed through the pattern exposure holes 108 and 128.

The pattern exposure holes 108 and 128 may be mechanically formed using an end mill and may be formed, in a non-contacting manner, by using a high energy beam such as a laser beam or an electron beam. The depth of each of the pattern exposure holes 108 and 128 can be known from design data of the printed-circuit board 100. The depth of a cut by a mechanical cutting tool such as the end mill is controlled in accordance with the design depth. The power of the laser beam which is pulsed and the number of projections of the laser beam are controlled so that the holes having the above depth are formed.

Figure 2:
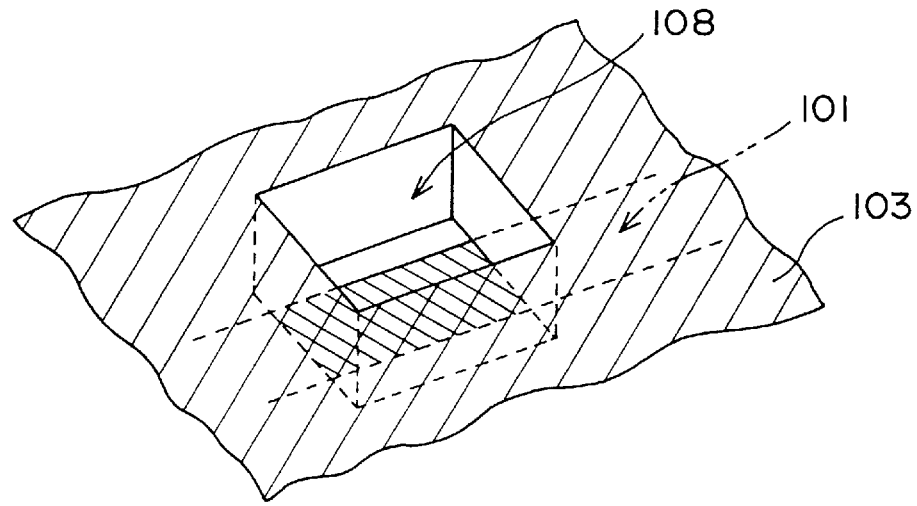
FIG. 2 is a diagram illustrating an example of a worked hole or opening formed on the printed-circuit board to alter the circuit pattern on an inner layer.

For example, the laser beam emitted by an excimer laser unit is masked so that the laser spot is squarely shaped. The laser beam is then projected onto the insulating body 103 of the printed-circuit board 100, so that the insulating body 103 is removed in square as shown in FIG. 2. That is, a square-shaped pattern exposure hole 108 through which the first circuit pattern 101 is exposed is formed. The mask of the laser beam is adjusted so that the width of the square-shaped pattern exposure hole 108 is slightly greater than the width of the first circuit pattern 101.

Figure 3:
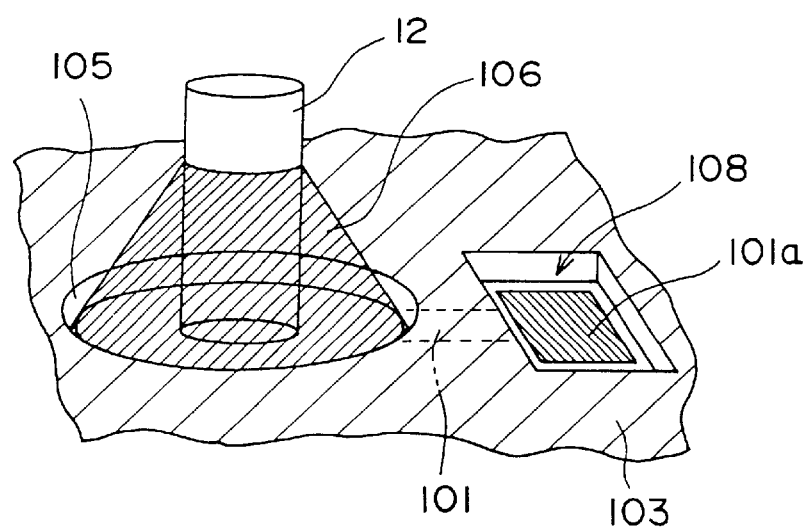
FIG. 3 is a diagram illustrating another example of the worked hole or opening.

As shown in FIG. 3, a wire connecting pad 101a may be formed on a part of the first circuit pattern 101, near the via-hole 104, covered with the resist layer (the insulating body 103). In this case, the resist layer is removed in a square by the laser beam from the excimer laser unit. As a result, the wire connecting pad 101a is exposed through the square-shaped pattern exposure hole 108. The mask of the laser beam is adjusted so that the spot area of the laser beam is slightly greater than the area of the wire connecting pad 101a.

After the parts of the first circuit pattern 101 connected with the pins 12 and 22 of the electronic components 11 and 21 are partially exposed as described above, electric connection bodies 109 and 129 are respectively formed on the exposed parts of the first circuit pattern 101 (the pattern exposure holes 108 and 128). The electric connection bodies 109 and 129 are then connected to each other by a wire 30. As a result, the pins 12 and 22 of the electronic components 11 and 21 are electrically connected to each other via the wire 30. That is, the first circuit pattern 101 is altered so that the pins 12 and 22 of the electronic components 11 and 21 are disconnected from other electronic components connected to the first circuit pattern 101 and are directly connected to each other.

Each of the electric connection bodies 109 and 129 is formed in the pattern exposure hole through which the first circuit pattern 101 is exposed, as shown in FIGS. 4A, 4B and 4C. FIGS. 4A, 4B and 4C show a case where the electric connection body is formed in the pattern exposure hole 108. The electric connection body is also formed in the pattern exposure hole 128 in the same manner as in this case.

The pattern exposure hole 108 though which the first circuit pattern 101 is exposed is filled with soldering paste 300 (a conductive connecting body) (see FIG. 4A and 4B). A core 32 projecting from a cover 31 of the wire 30 is then inserted into the soldering paste 300 (see FIG. 4B). In this state, the soldering paste 300 is melted by hot-air heat, $CO_2$ laser beam or the like. After this, the soldering paste 300 which has been melted is hardened (see FIG. 4C). As a result, the electric connection body 109 having a structure in which the core 32 of the wire 30 is electrically connected to the first circuit pattern 101 by the solder 300 is formed in the pattern exposure hole 108.

Solder wire, solder ribbon, solder plate and solder ball may be used in place of the soldering paste 300. Further, conductive adhesive may be used as the conductive connecting body in place of the solder.

The electric connection body may be formed in accordance with a procedure shown in FIGS. 5A, 5B and 5C.

In this case, a solder lump 300 is attached to the core 32 projecting from the cover 31 of the wire 30 in accordance with a method of the screen deposition. The solder lump 300 has a volume which can be placed in the pattern exposure hole 108 and is enough to form a pertinent electric connection body. The tip end of the wire 30 to which the solder lump 300 is attached is inserted into the pattern exposure hole 108 through which the first circuit pattern 101 is exposed (see FIGS. 5A and 5B). In this state, the solder lump 300 is heated so as to be melted in the pattern exposure hole 108 (see FIG. 5C). The solder which has been melted is hardened, so that the electric connection body is formed in the pattern exposure hole 108.

Figure 6A:
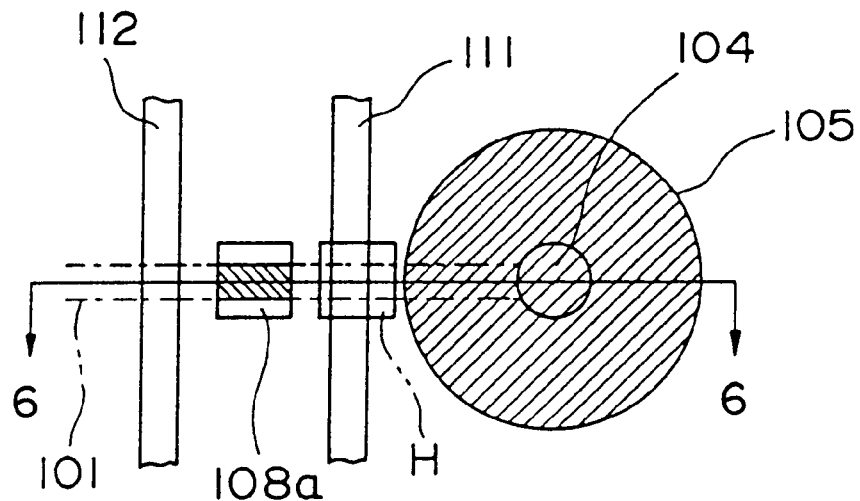
FIGS. 6A and 6B are diagrams illustrating an example of a position at which the circuit pattern is exposed.
Figure 6B:
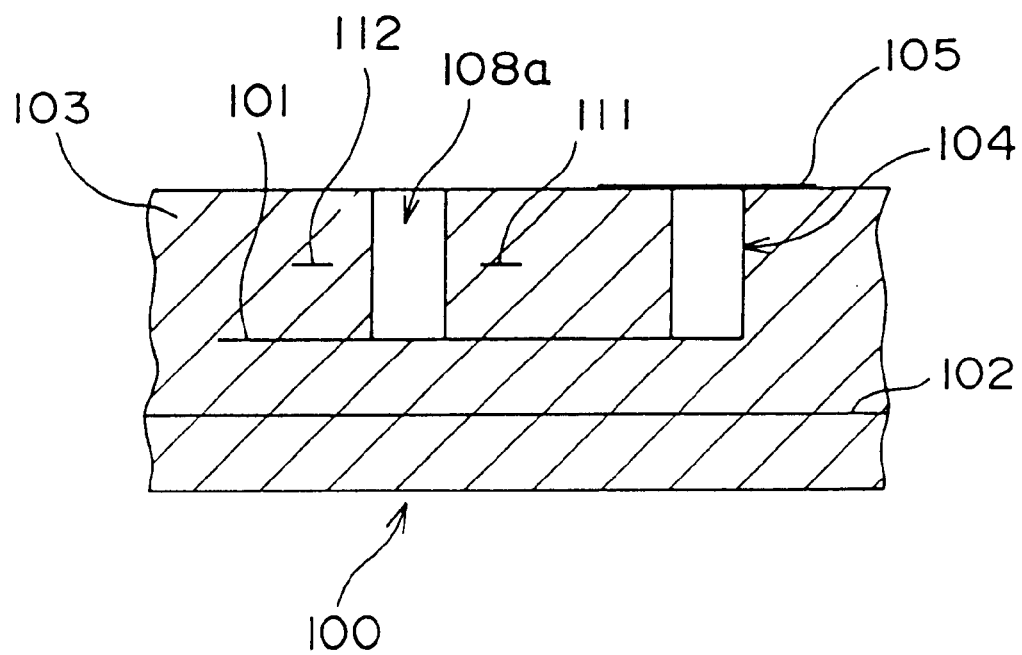

As has been described above, a circuit pattern is partially exposed to alter the circuit pattern of the multi-layer printed-circuit board (forming of the pattern exposure holes 108 and 128). In this case, care must be taken that other circuit patterns located near the circuit pattern to be altered are not damaged. FIG. 6A shows a portion near a position at which the pattern exposure hole is formed. FIG. 6B is a cross sectional view taken along line 6—6 shown in FIG. 6A. In a case shown in FIGS. 6A and 6B, other circuit patterns 111 and 112 are located over the circuit pattern 101 which is to be exposed. If a pattern exposure hole H is formed at a position near a pin of an electronic component inserted into the via-hole 104, the pattern exposure hole H interferes with the circuit pattern 111. Thus, the pattern exposure hole H can not be formed at the position. In this case, it is decided, based on the design data of the printed-circuit board 100, that a pattern exposure hole 108a is formed at a position in an area between the other circuit patterns 111 and 112.

When design changes regarding the power line or the ground line are made, the sheet-shaped circuit pattern 102 used for the power line or the ground line is altered. In this case, the sheet-shaped circuit pattern (the second circuit pattern) 102 is partially exposed and an exposed part of the sheet-shaped circuit pattern 102 is connected to a desired portion by a wire in the same manner as in the case of the first circuit pattern 101.

Since the sheet-shaped circuit pattern 102 has a relatively wide area, a position at which the pattern exposure hole should be formed can be roughly decided in comparison with the case of the line-shaped circuit pattern (the first circuit pattern) 101. However, in a case where the sheet-shaped circuit pattern 102 is located in a deep layer, line-shaped circuit patterns may be complicatedly located over the sheet-shaped circuit pattern 102. Thus, care must be taken that circuit patterns located over the sheet-shaped circuit pattern are not damaged.

Figure 7A:
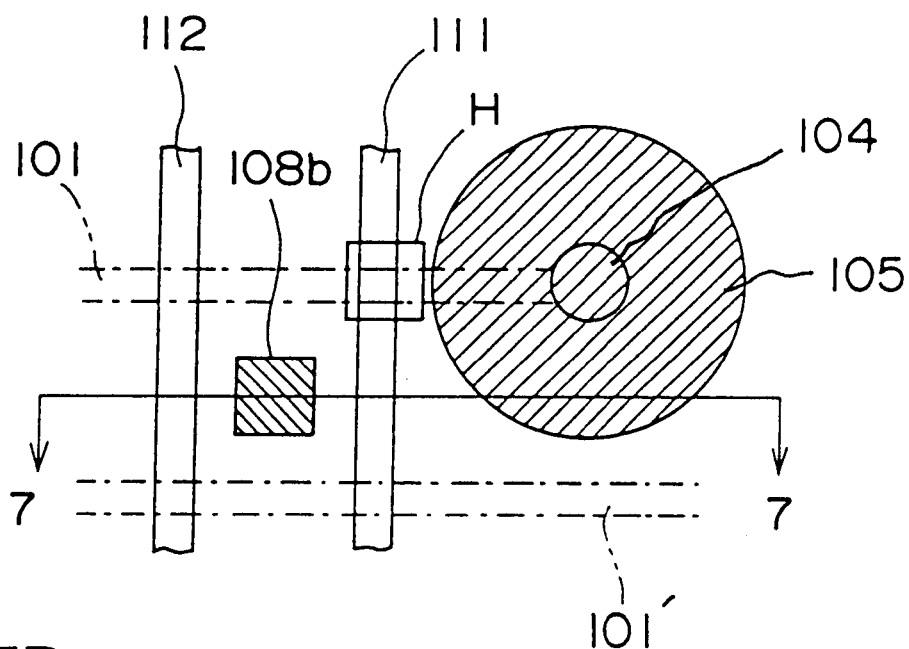
FIGS. 7A and 7B are diagrams illustrating another example of a position at which the circuit pattern is exposed.
Figure 7B:
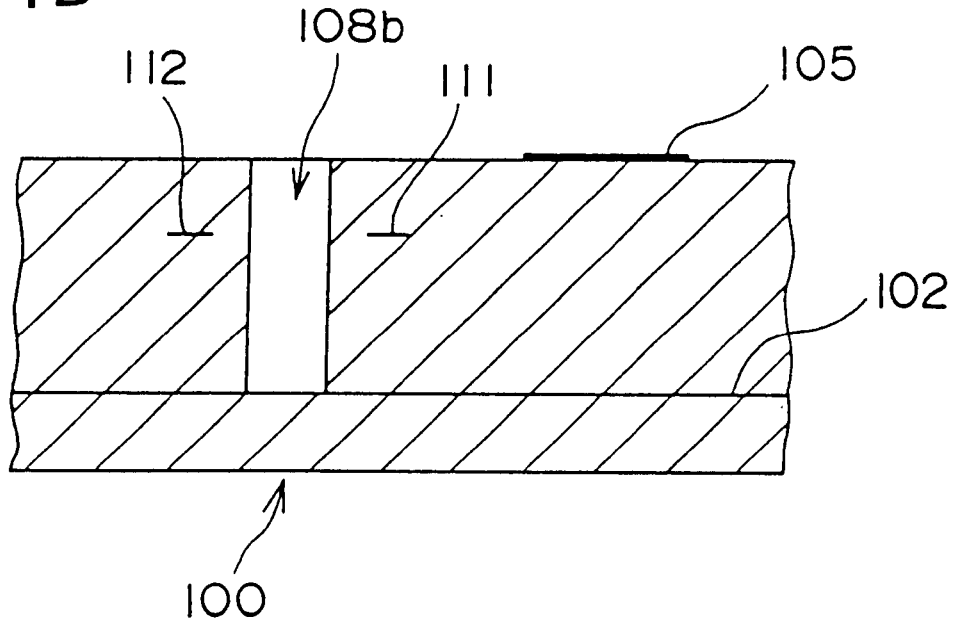

FIG. 7A shows a portion near a position at which the pattern exposure hole for the sheet-shaped circuit pattern 102 is formed. FIG. 7B is a cross sectional view taken along line 7—7 shown in FIG. 7A. If a pattern exposure hole H is formed at a position near a pin of an electronic component inserted into the via-hole 104, the pattern exposure hole H interferes with the circuit pattern 101 and 111 located over the sheet-shaped circuit pattern 102. Thus, the pattern exposure hole H can not be formed at the position. In this case, it is decided, based on the design data of the printed-circuit board 100, that a pattern exposure hole 108a is formed at a position in an area surrounded by circuit patterns 111, 112, 101 and 101'.

For example, a circuit pattern located under the sheet-shaped circuit pattern 102 is partially exposed, an exposed part of the circuit pattern is connected to another portion by the wire. In this case, the pattern exposure hole for the circuit pattern passes through the sheet-shaped circuit pattern 102 and reaches the circuit pattern. The pattern exposure hole may be formed by the laser beam from the excimer laser unit. When the laser beam passes through (partially removes) the sheet-shaped circuit pattern 102, metal powder caused by the abrasion of material (copper) of the sheet-shaped circuit pattern 102 is adhered to an inner wall of the pattern exposure hole. Thus, if the pattern exposure hole is formed so as to reach the circuit pattern to be exposed straight out, the sheet-shaped circuit pattern 102 and the circuit pattern which is located under the sheet-shaped circuit pattern 102 and is to be exposed may be short-circuited by the metal powder (insulation defects).

Figure 8:
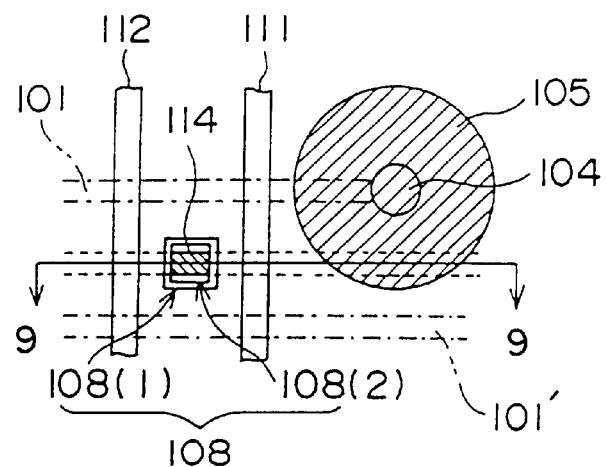
FIG. 8 is a diagram illustrating a position at which the circuit pattern under a sheet-shaped circuit pattern in the printed-circuit board is exposed.
Figure 9A:
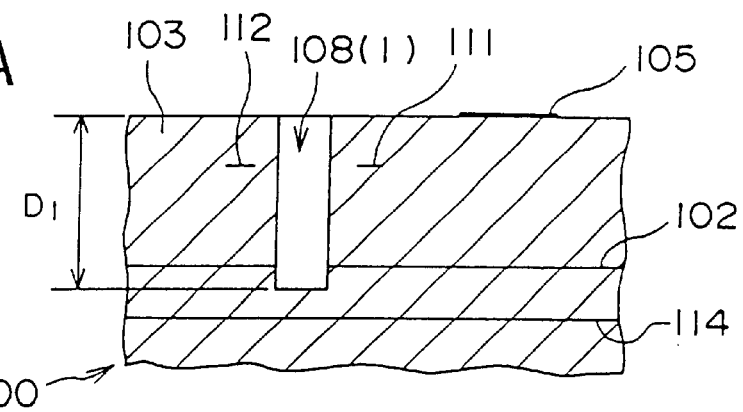
FIGS. 9A and 9B are diagrams illustrating a process for forming the hole through which the circuit pattern is exposed at the position shown in FIG. 8.
Figure 9B:
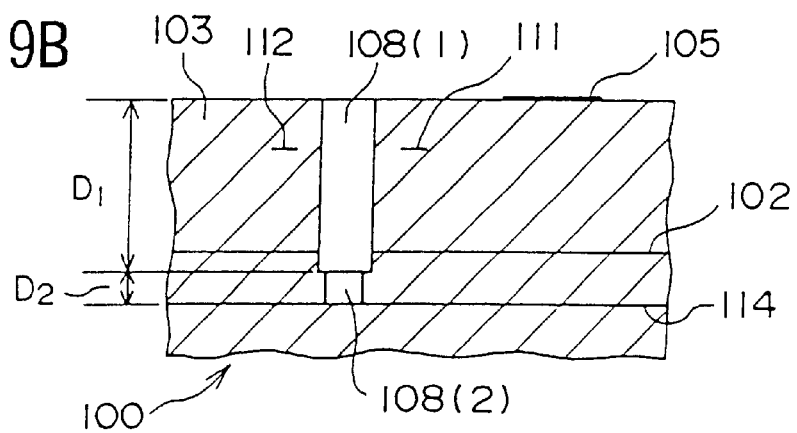

To prevent the short circuit between the sheet-shaped circuit pattern 12 and the circuit pattern to be exposed, it is preferable that the pattern exposure hole for the circuit pattern located under the sheet-shaped circuit pattern is formed in accordance with a procedure as shown in FIGS. 8, 9A and 9B. FIG. 8 is a plan view showing a portion in which the pattern exposure hole should be formed. FIGS. 9A and 9B are cross sectional views taken along line 9—9 shown in FIG. 8.

A position on a plane at which the pattern exposure hole 108 for a circuit pattern 114, located under the sheet-shaped circuit pattern 102, is decided as shown in FIG. 8, based on the design data of the printed-circuit board 100. That is, the position of the pattern exposure hole 108 on the plane is decided so that the pattern exposure hole 108 does not interfere with all the circuit patterns 111, 112, 101 and 101' located over the sheet-shaped circuit pattern 102.

The laser beam from the excimer laser unit is masked so as to have a square-shaped beam spot. The pulsed laser beam is projected at the position, decided as described above, on the surface of the insulating body 103 of the printed-circuit board 100. The mask of the laser beam is adjusted so that the laser beam spot formed on the surface of the insulating body 103 has a first area. The insulating body 103 is removed by the pulsed laser beam projected from the excimer laser unit onto the insulating body 103. As a result, as shown in FIG. 9A, a first hole 108(1) having a square-shaped cross section is formed. That is, the laser beam passes through the sheet-shaped circuit pattern 102, and the first hole 108(1) having a predetermined depth D1 is formed. The intensity of the laser beam and the number of times which the laser beam is projected (the number of pulses) are decided, based on the material of the insulating body 103 and the sheet-shaped circuit pattern 102, so that the depth D1 of the first hole 108(1) is slightly greater than the length between the surface of the insulating body 103 and the sheet-shaped circuit pattern 102.

Next, the mask of the laser beam is adjusted so that the area of the laser beam spot is changed from the first area to a second area which is narrower than the first area. In this state, the pulsed laser beam is further projected onto a bottom surface of the first hole 108(1). As a result, as shown in FIG. 9B, a second hole 108(2) expanding from the bottom surface of the first hole 108(1) to the circuit pattern 114 is formed. The depth D2 of the second hole 108(2) corresponds to the difference between the length from the surface of the insulating body 103 to the circuit pattern 114 and the depth D1 of first hole 108(1). Thus, the intensity of the laser beam and the number of times which the laser beam is projected (the number of pulses) decide the depth of the second hole 108(2) is equal to D2 corresponding to the above difference.

The aperture area of the second hole 108(2) (corresponding to the second area of the laser beam spot) is decided, as shown in FIG. 8, so as to have enough area to form the electric connection body on the exposed portion of the circuit pattern 114. The aperture area of the first hole 108(1) (corresponding to the first area of the laser beam spot) is decided so as to be slightly greater than the second area. Thus, the pattern exposure hole 108 through which the circuit pattern 114 located under the sheet-shaped circuit pattern 102 is exposed has a structure in which there is a step in a boundary between the first hole 108(1) and the second hole 108(2).

In the case where the pattern exposure hole 108 (the first and second holes 108(1) and 108(2)) is formed by switching the laser beam spot area in two steps, the metal powder of the sheet-shaped circuit pattern 102 may be adhered to the wall of the first hole 108(1). However, since after the first hole 108(1) passes through the sheet-shaped circuit pattern 102, the second hole 108(2) is formed, the metal powder is not adhered to the wall of the second hole 108(2). Thus, the insulation defects between the circuit pattern 114 and the sheet-shaped circuit pattern 102 located above the circuit pattern 114 can be prevented.

After the pattern exposure hole 108 through which the circuit pattern 114 located under the sheet-shaped circuit pattern 102 is exposed is formed as described above, the electric connection body is formed on the exposed potion of the circuit pattern 114 in accordance with a procedure as shown in FIGS. 10A, 10B and 10C. The electric connection body is fixed with a tip end of a wire used to electrically connect to another portion.

The core 32 projecting from the cover 31 of the wire 30 is plated with solder so that a solder plating layer 301 covers the core 32 of the wire 30. The core 32 projecting from the cover 31 is bent at 90°. In this state, the core 32 of the wire 30 is inserted into the pattern exposure hole 108 formed as described above (see FIGS. 10A and 10B). The core 32 which is bent at 90° and plated with solder is pressed against the circuit pattern 114 by the reflow-chip 400. In this state, the core 32 is heated by hot-air (see FIG. 10C). The solder plating layer 301 covering the core 32 is thus melted. After the hot-air supplied to the core 32 is stopped, the solder which has been melted is hardened. As a result, the core 32 is electrically connected to the circuit pattern 114 by the solder 301. The wire 30 connected to the circuit pattern 114 is drawn out of the pattern exposure hole 108, and another end of the wire 30 is connected to a predetermined portion of the printed-circuit board 100.

In the above case, the second hole 108(2) has to have enough aperture area to insert the core 32 which is bent into the second hole 108(2). The depth D2 of the second hole 108(2) is decided so that the core 32 projecting from the cover 31 of the wire 30 is not in contact with the sheet-shaped circuit pattern 102.

Figure 11:
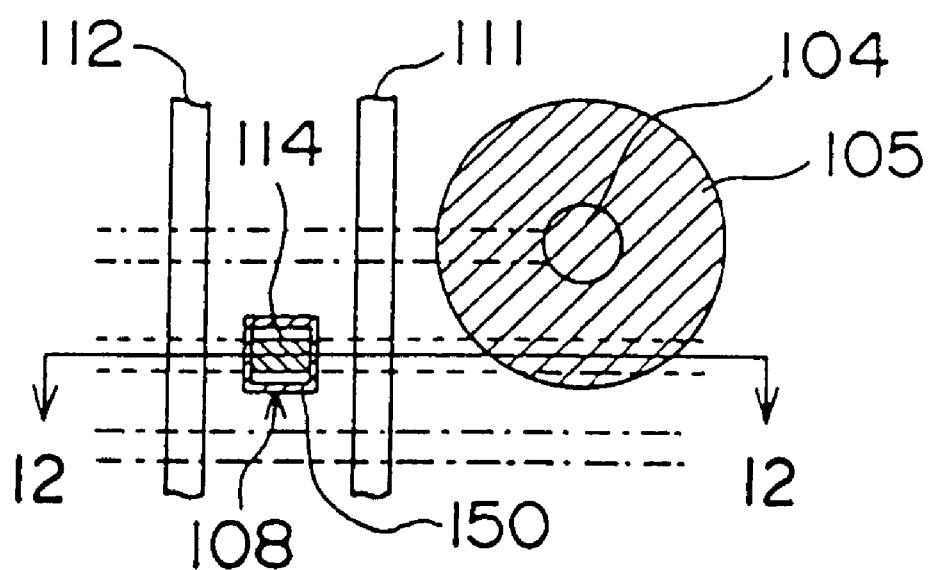
FIG. 11 is a diagram illustrating a position at which the circuit pattern located under a sheet-shaped circuit pattern in the printed-circuit board is exposed.
Figure 12A:
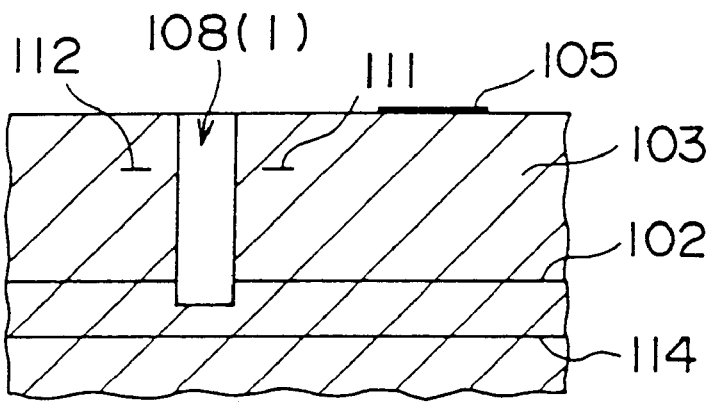
FIGS. 12A, 12B and 12C are diagrams illustrating a process for forming a hole through which the circuit pattern is exposed at the position shown in FIG. 11.
Figure 12B:
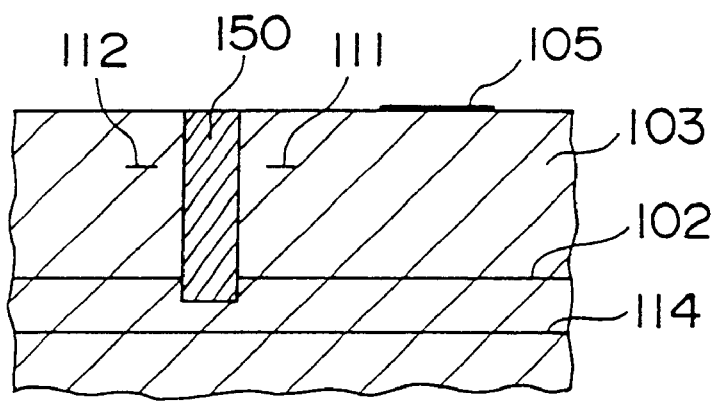
Figure 12C:
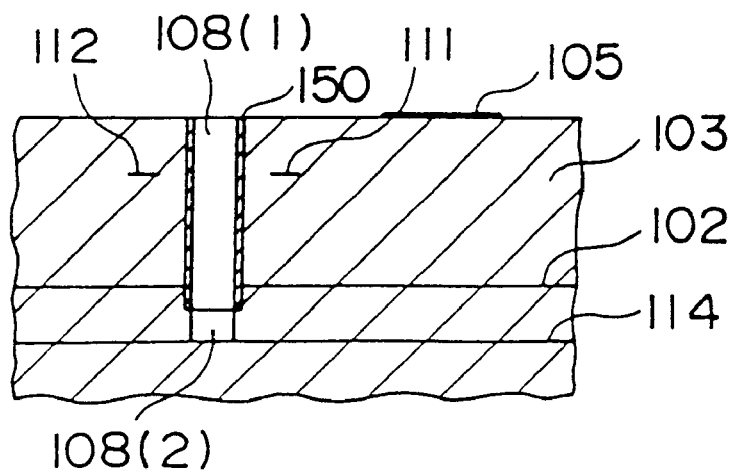

To positively prevent the metal powder generated when the sheet-shaped circuit pattern 102 is partially removed by the laser beam from causing the insulation defects between the sheet-shaped circuit pattern 102 and the circuit pattern 114, the pattern exposure hole 108 may be formed in accordance with a procedure as shown in FIGS. 11, 12A, 12B and 12C. FIG. 11 is a plan view showing a portion near a position at which the pattern exposure hole is formed. FIGS. 12A, 12B and 12C are cross sectional views taken along line 12—12 shown in FIG. 11.

A position on a plane at which the pattern exposure hole should be formed is decided so that the pattern exposure hole does not interfere with all circuit patterns located over the sheet-shaped circuit pattern 102 (see FIG. 11), in the same manner as in the case shown in FIG. 8. The pulsed laser beam from the excimer laser unit is masked so as to have the square-shaped spot of the first area. The pulsed laser is projected at the position, decided as described above, on the insulating body 103, so that the first hole 108(1) is formed (see FIG. 12A), in the same manner as in the case shown in FIG. 9A. The first hole 108(1) passes through the sheet-shaped circuit pattern 102.

After this, as shown in FIG. 12B, the first hole 108(1) formed as described above is filled with insulating resin 150. The mask of the laser beam from the excimer laser unit is adjusted so that the laser beam spot is changed from the first area to the second area which is narrower than the first area. In this state, the pulsed laser beam is projected on to the insulating resin 150. A portion of the insulating resin 150 corresponding to the laser beam spot having the second area is removed by the laser beam. As a result, a hole is formed concentric with the first hole 108(1). After the laser beam passes through the insulating resin 150, the projection of the laser beam is continued. A second hole 108(2) having an aperture of the second area is formed from the bottom surface of the insulating resin 150 to the circuit pattern 114 (see FIG. 12C).

As the result of the above process, the first hole 108(1) in which the inner surface is coated with the insulating resin 150 and the second hole 108(2) in which the inner surface is not coated with the insulating resin form the pattern exposure hole 108.

According to the above manner in which the pattern exposure hole 108 for the circuit pattern 114 located under the sheet-shaped circuit pattern 102 is formed, even if metal powder is generated while the first hole 108(1) is being formed, the cutting surface of the sheet-shaped circuit pattern 102 and the generated metal powder are covered with the insulating resin 150. Thus, even if the hole is formed from the insulating resin 150 to the surface of the circuit pattern 114 to be exposed, the electrical insulation between the circuit pattern 114 and the sheet-circuit pattern 102 is reliably maintained.

Further, in a case where the circuit pattern 114 located under the sheet-shaped circuit pattern 102 is cut, it is preferable that the circuit pattern 114 is cut by forming a stepped hole in the same manner as in the case shown in FIGS. 9A and 9B.

Figure 13C:
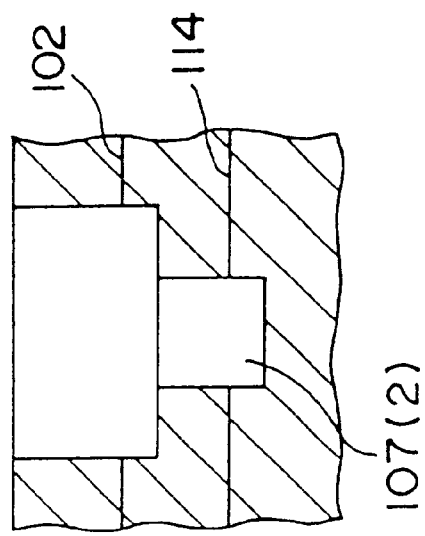
FIGS. 13A, 13B and 13C are diagrams illustrating a process for cutting the circuit pattern located under a sheet-shaped circuit pattern in the printed-circuit board.
Figure 13B:
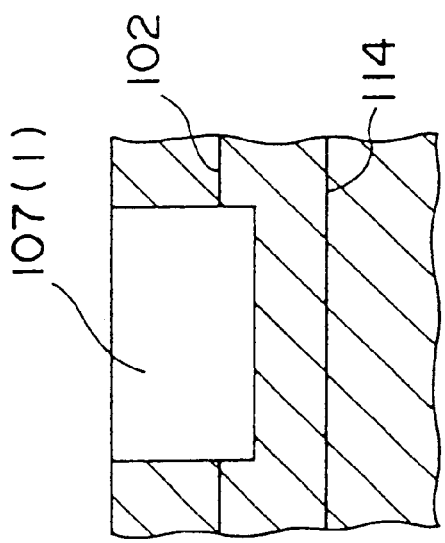
Figure 13A:
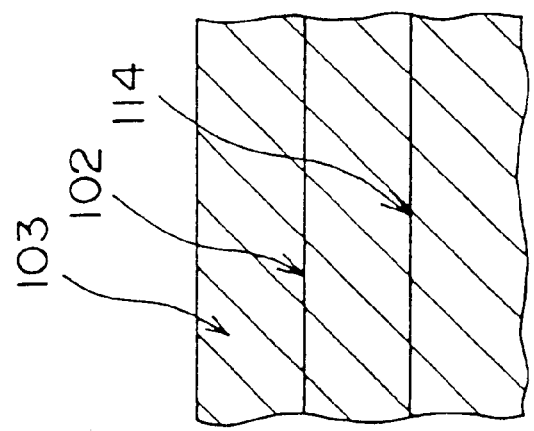

As shown in FIG. 13A, 13B and 13C, the pulsed laser beam, having a square-shaped beam spot, from the excimer laser unit is projected onto the surface of the insulating body 103 covering the sheet-shaped circuit pattern 102. First, the mask of the laser beam is adjusted so that the square-shaped beam spot has a first area. A first hole 107(1) which passes through the sheet-shaped circuit pattern 102 is formed (see FIGS. 13A and 13B). After this, the mask of the laser beam is adjusted so that the square-shaped beam spot has a second area less than the first area. In this state, the pulsed laser beam is further projected onto the insulating body 103. As a result, a second hole which cuts the circuit pattern 114 is formed (see FIG. 13C).

As has been described above, a cutting hole for cutting the circuit pattern 114 located under the sheet-shaped circuit pattern 102 is formed of the first hole 107(1) which passes through the sheet-shaped circuit pattern 102 and the second hole 107(2) having an aperture area less than that of the first hole 107(1). As a result, the insulation defects between the sheet-shaped circuit pattern 102 and the circuit pattern 114 which is cut can be prevented.

In a case where a circuit pattern of the printed-circuit board is altered, the circuit pattern is generally cut. The circuit pattern (formed on or inside the printed-circuit board) is cut by using a mechanical tool (e.g. a drill) or by using a high energy beam such as the laser beam or the electron beam in the non-contact manner. A detailed description will now be given of high-quality methods for cutting the circuit pattern of the printed-circuit board.

Figure 14:
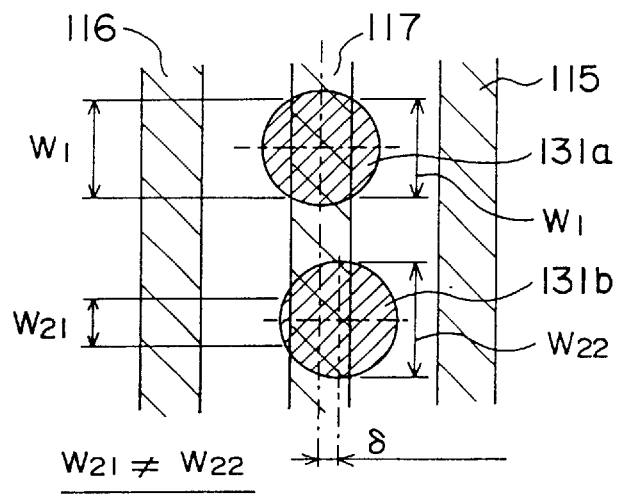
FIG. 14 is a diagram illustrating examples of holes mechanically formed to cut the circuit pattern inside the printed-circuit board.

As shown in FIG. 14, in a case where a circuit pattern 117 between circuit patterns 115 and 116 is mechanically cut by using a tool such as a drill, it is ideal that the center of a cutting hole 131a formed by the tool is positioned on the center line of the circuit pattern 117. In this ideal case, a gap between cut ends of the circuit pattern 117 has a uniform value of W1. However, when the center of a cutting hole 131b formed by the tool is shifted by δ from the center line of the circuit pattern 117, the gap between the cut ends of the circuit pattern 117 is non-uniform as shown in FIG. 14. For example, at a side of the circuit pattern 117, the gap has a value of W21, and at an opposite side of the circuit pattern 117, the gap has a value of W22 greater than W21. If the center of the cutting hole 131b is shifted too much from the center line of the circuit pattern 117, a side of the circuit pattern 117 may not be completely cut.

Figure 15:
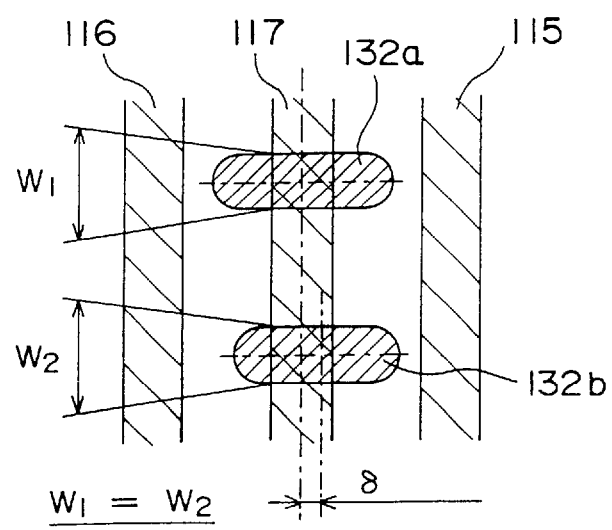
FIG. 15 is a diagram illustrating holes improved in comparison with the holes shown in FIG. 14.

Thus, to cut the circuit pattern 117 so that the gap between the cut ends of the circuit pattern 117 is uniform even if the center of a cutting hole is slightly shifted from the center line of the circuit pattern 117, the cutting hole in which a cross section is worked into an extended-circular shape is formed as shown in FIG. 15. In this case, data regarding positions, widths, inclinations and the like of the circuit pattern to be cut are extracted from design data of the printed-circuit board, image recognition results, results of direct observation or the like. An insert start position, an insertion depth, a moving direction and a moving distance of the tool such as the drill are then decided based on the above extracted data. After this, drilling work starts at the insert start position. After the tool reaches the decided insertion depth, the tool is moved in the decided moving direction by the decided moving distance. The printed-circuit board may be moved, instead of the tool, in a direction opposite to the decided moving direction. As a result, the cutting hole 132a has a cross section which is an extended-circular shape as shown in FIG. 15. The circuit pattern 117 is cut by the cutting hole 132a.

The moving direction is set, for example, so as to be parallel to the width direction of the circuit pattern 117 to be cut. In this case, even if the center of the cutting hole 132a is slightly shifted (by δ) from the center line of the circuit pattern 117, the gap between the ends of the cut circuit pattern 117 is uniform (W1=W2).

Figure 18:
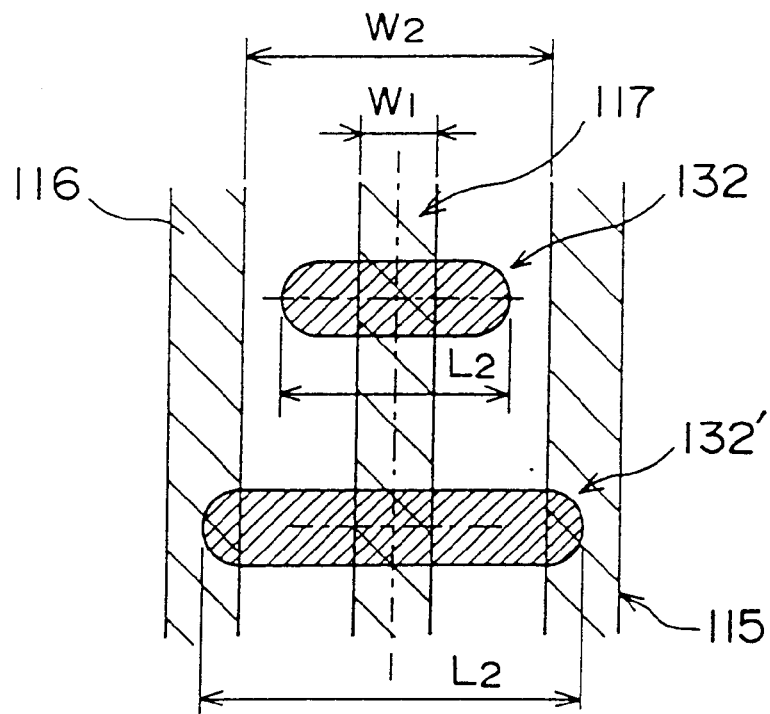
FIG. 18 is a diagram illustrating holes having widths which are acceptable to cut the circuit pattern inside the printed-circuit board (1st)

The moving direction may not be parallel to the width direction of the circuit pattern 117. The moving direction is decided so that the circuit pattern is completely cut by the tool moved by the decided distance. In addition, the moving distance is not less than the width W1 of the circuit pattern 117 to be cut as shown in FIG. 18. The moving distance is decided so that other circuit patterns located in the same layer as the circuit pattern 117 and located over the circuit pattern 117 are not broken by the cutting hole. That is, the moving distance is decided so that the length L2 of the aperture of the cutting hole 132 (132') is less than the distance W2 between the circuit patterns 115 and 116 between which the circuit pattern 117 to be cut is positioned, as shown in FIG. 18.

Figure 16:
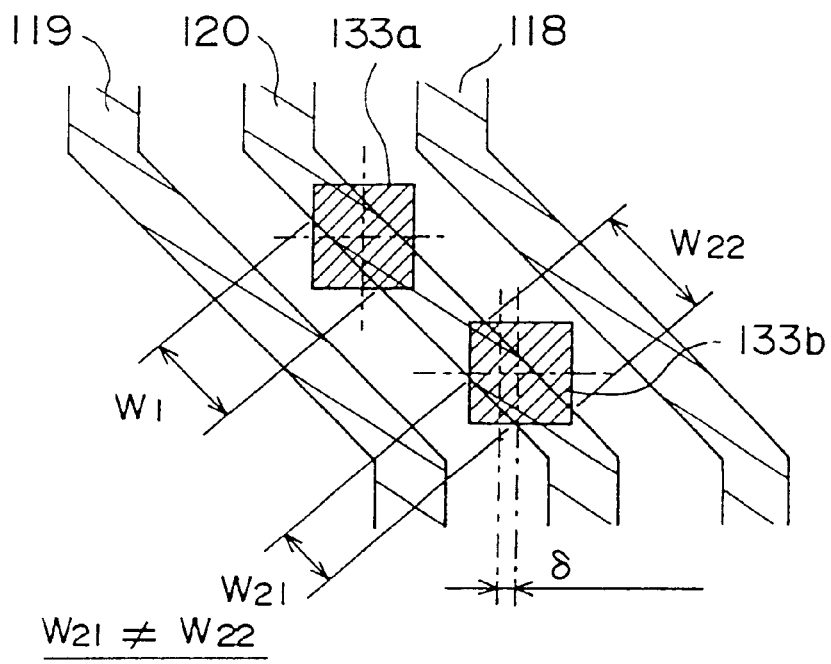
FIG. 16 is a diagram illustrating examples of holes formed using a high energy beam to cut the circuit pattern inside the printed-circuit board.

As shown in FIG. 16, in a case where a bent circuit pattern 120 put between bent circuit patterns 119 and 118 is cut using a laser beam in the non-contact manner, it is ideal that the center of the square-shaped beam spot 133a of the laser beam is positioned on the center line of the circuit pattern 120. In this ideal case, the gap between cut ends of the circuit pattern 120 is uniform (W1) at both sides of the circuit pattern 120. However, if the square-shaped beam spot 133b of the laser beam is shifted by δ from the center line of the circuit pattern 120, the gap (W21) of the cut ends of the circuit pattern 120 in a side differs from the gap (W22) of the cut ends of the circuit pattern 120 in an opposite side (W12=W22). That is, the gap between the ends of the circuit pattern 120 is non-uniform at both sides of the circuit pattern 120. If the center of the square-shaped beam spot of the laser beam is shifted too much from the center line of the circuit pattern 120, a side of the circuit pattern 120 may not be completely cut.

Figure 17:
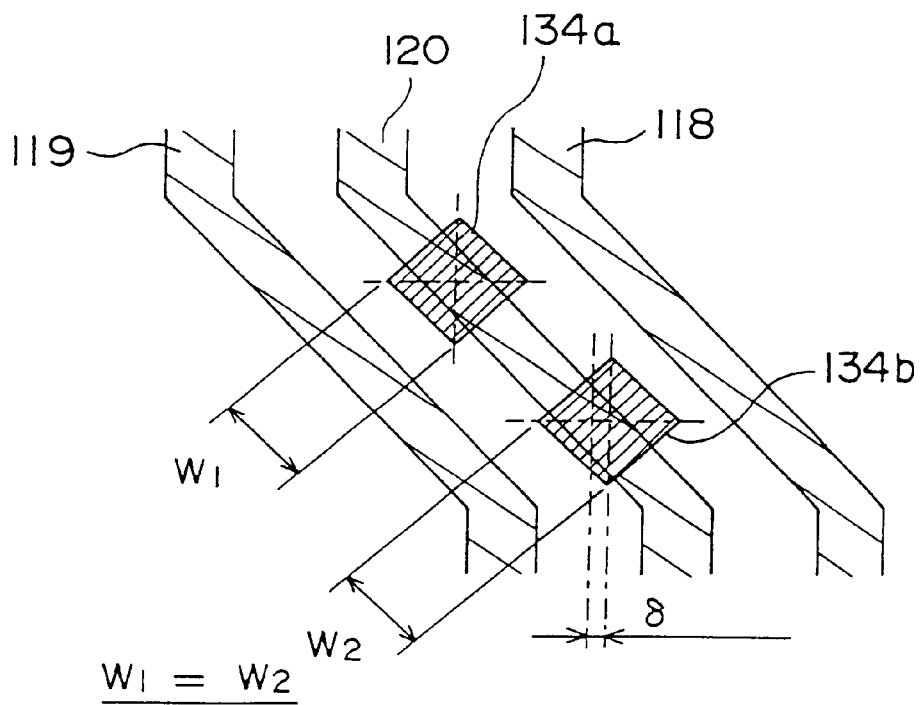
FIG. 17 is a diagram illustrating holes improved in comparison with the holes shown in FIG. 16.

Thus, to cut the circuit pattern 120 in a state where the gap between the cut ends of the circuit pattern 120 is uniform even if the beam spot of the laser beam is slightly shifted from an ideal position, the laser beam is projected onto the circuit pattern 120 as shown in FIG. 17. Referring to FIG. 17, the angle of the mask of the laser beam is adjusted so that a projection area of the laser beam on the circuit pattern 120 is not changed even if the square-shaped beam spot of the laser beam is slightly shifted in a predetermined direction. In an example, data regarding the width, the inclination and the like of the circuit pattern 120 to be cut are extracted from the design data of the printed-circuit board, image recognition results, results of direct observation or the like. The size and the angle of the mask of the laser beam is adjusted so that the length of the beam spot in a direction parallel to the width direction of the circuit pattern 120 is uniform. In a case shown in FIG. 17, the angle of the mask is adjusted so that two sides of the square-shaped beam spot are parallel to the sides of the circuit pattern 120 to be cut and two other sides of the square-shaped beam spot are perpendicular to the sides of the circuit pattern 120. In this case, even if the square-shaped beam spot is slightly shifted (δ) in a horizontal direction, the projection area of the laser beam on the circuit pattern 120 is almost not changed. Thus, in the case where the circuit pattern 120 is cut by the laser beam for which the mask is adjusted as described above, even if the beam spot of the laser beam is slightly shifted, the gap between the cut ends of the circuit pattern 120 can be uniform (W1=W2).

Figure 19:
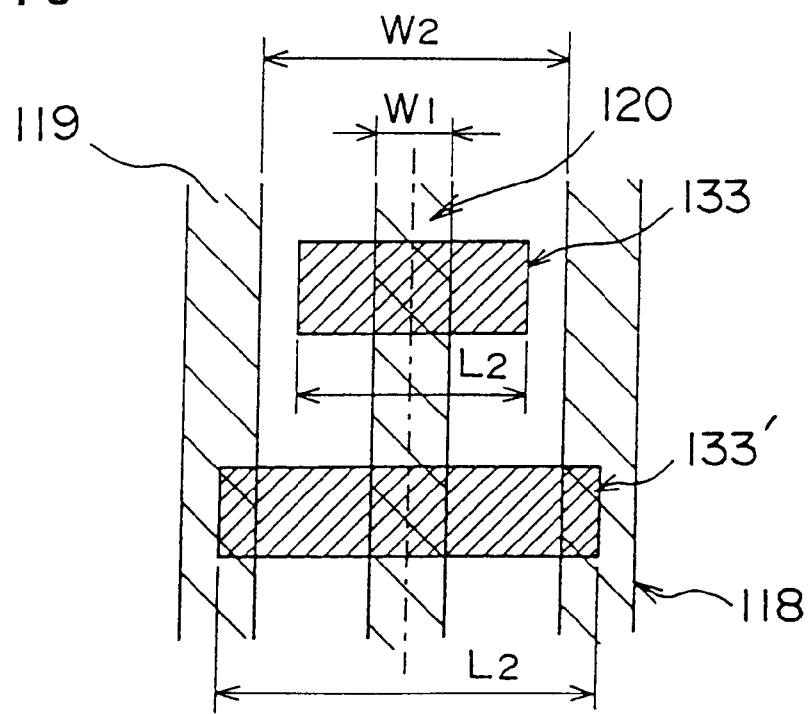
FIG. 19 is a diagram illustrating holes having widths which are acceptable to cut the circuit pattern inside the printed-circuit board (2nd)

Further, in the case where the circuit pattern is cut by a laser beam in the non-contacting manner, the circuit pattern may be scanned by the laser beam having the square-shaped spot. In this case, as shown in FIG. 19, a scanning range (length) of the laser beam is decided so as to be greater than the width W1 of the circuit pattern 120 to be cut. In addition, the scanning range of the laser beam is decided so that other circuit patterns in the same layer as the circuit pattern 120 to be cut and over the circuit pattern 120 are not damaged. That is, the scanning range of the laser beam is decided so that the length L2 of a projection area 133 (133') is less than the distance W2 between the circuit patterns 118 and 119 between which the circuit pattern 120 to be cut is positioned.

In a process in which the insulating body and the circuit patterns are partially removed by using a high energy beam such as a laser beam or an electron beam, the deeper in the printed-circuit board, the narrower the region (the area) to be worked by the high energy beam. The reason for the above is that the high energy beam is diffracted inside the printed-circuit board. The degree of variation (narrowing) of the region to be worked by the high energy beam depends on material of the region. Thus, in a case where the multi-layer printed-circuit board is worked, the projection area (the mask size) of the beam on the surface of the printed-circuit board is decided based on the thicknesses of the respective layers and the degrees of narrowing of regions to be worked in the respective layers.

Figure 20:
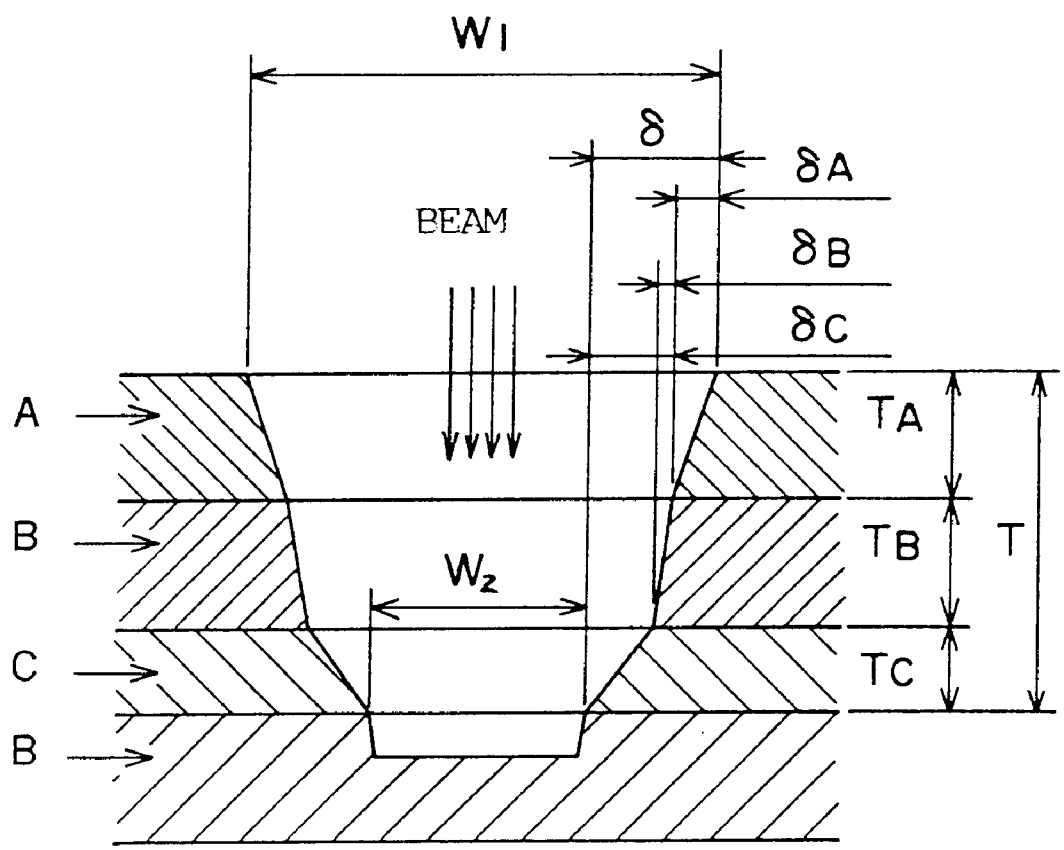
FIG. 20 is a cross sectional view illustrating a structure of a hole formed to cut the circuit pattern inside the printed-circuit board.

For example, a multi-layer printed-circuit board is formed as shown in FIG. 20. Referring to FIG. 20, the printed-circuit board has a first layer made of material A (e.g., a resist layer), a second layer made of material B (e.g., an insulating layer), a third layer (a circuit pattern) made of material C (e.g. copper) and a fourth layer made of material D. The first layer has the thickness of $T_A$, the second layer has the thickness of $T_B$, and the third layer has the thickness of $T_C$ ($T=T_A+T_B+T_C$). The degree of narrowing of the region to be worked in the respective layers has been previously measured by using a laser beam which is actually used to work the printed-circuit board. The degree of narrowing of the region to be worked is represented by a narrowing coefficient (ratio) K. The narrowing coefficient (ration) K in a structure (the first, second and third layers) to be worked is defined by $$K=\delta/T$$

where T is the thickness of the structure to be worked and δ is the difference between a position of the edge of the projection area of the laser beam on the surface of the first layer and a position of the edge of a region to be worked on the bottom surface of the third layer.

In a case where the circuit pattern of the third layer in the printed-circuit board structured as described above is cut so that a gap of W2 is formed between cut ends of the circuit pattern, the width W1 of the projection area (the mask size) of the laser beam (the excimer laser beam) on the surface of the printed-circuit board (the surface of the first layer) is decided as follows.

$$W1 = W2 + 2\delta = W2 + 2(\delta_A + \delta_B + \delta_C)$$
$$= W2 + 2(K_A \times T_A)$$
$$+ 2(K_B \times T_B)$$
$$+ 2(K_C \times T_C)$$

That is, the mask of the laser beam is adjusted so that the projection area of the laser beam on the surface of the printed-circuit board has the width of W1.

In addition, a working rate R of the laser beam, which is actually used to work the printed-circuit board, with each of materials of the respective layers has been measured. The working rate R is defined as $$R=d/N$$

where d is the depth of a hole formed by the laser beam and N is the number of times which the laser beam is projected onto the material or a time for which the laser beam is projected onto the material. The number of times which the laser beam is projected on to each layer (the number of pulses) or the times for which the laser beam is projected onto each layer is controlled based on the working rate R with respect to the material of each layer.

Figure 21:
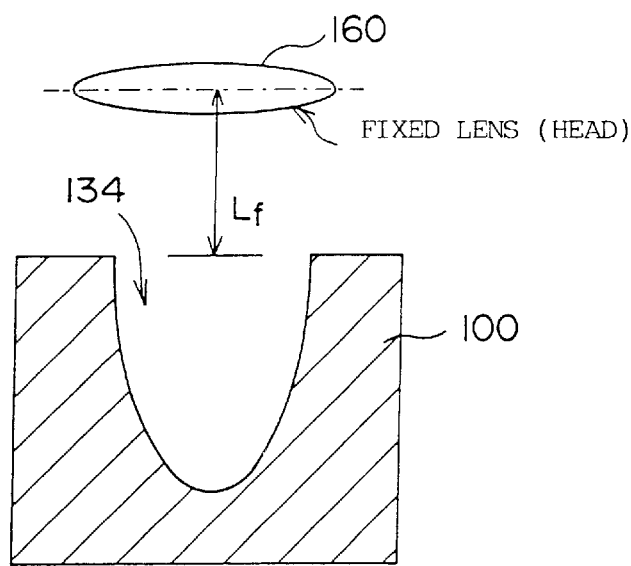
FIG. 21 is a cross sectional view illustrating a hole formed using a beam and a focus point of the beam.

The laser beam or the electron beam used to cut the circuit pattern is focused, as shown in FIG. 21, on the surface of the printed-circuit board 100 by a lens 160 having a focal length $L_f$. If the circuit pattern to be cut is placed at a deep position in the printed-circuit board, while the region which is worked by the laser beam or the electron beam is being moved inside the printed-circuit board 100, the degree of out-of-focus of the laser beam or the electron beam on the worked region is increased. Thus, while the worked region is being moved inside the printed-circuit board, the energy density of the laser beam or the electron beam on the worked region is decreased, so that substantial narrowing coefficient (ratio) K of the worked region is increased. The amount of insulating material which is removed from the worked region by the laser beam is reduced, so that the bottom of the worked hole 134 formed by the laser beam is narrow and curved. As a result, the gap between cut ends of the circuit pattern located at a deep position in the printed-circuit board 100 is small. That is, the gap is varied in accordance with the position of the circuit pattern in the depth direction.

Figure 22:
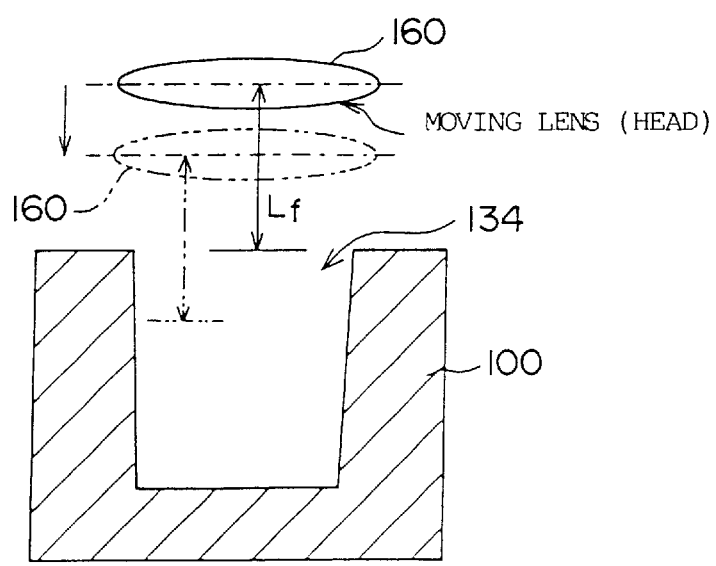
FIG. 22 is a cross sectional view illustrating a hole formed using a beam in which a focus point is adjusted.

To eliminate the above disadvantage, as shown in FIG. 22, the lens 160 or a laser head emitting the laser beam is moved in synchronism with the movement of the region which is worked by the laser beam in the printed-circuit board 100. As a result, while the printed-circuit board 100 is being worked by the laser beam, the laser beam is always focused on the worked region. The movement of the lens 160 or the laser head is controlled based on the working rate R of the laser beam with respect to the material of each of the layers in the printed-circuit board 100.

According to the above control of the lens 160 or the laser head, the bottom of the worked hole 134 can be flat as shown in FIG. 22. As a result, the variation of the gaps formed in cut circuit patterns in the respective layers of the printed-circuit board can be reduced.

Figure 23A:
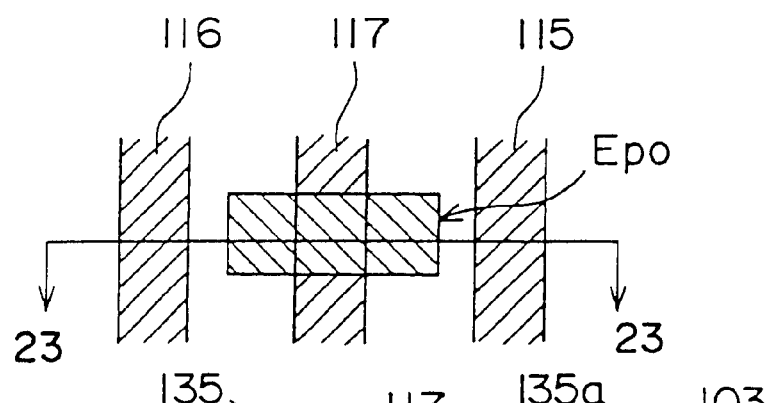
FIGS. 23A and 23B are diagrams illustrating an example of a mask for a beam used to cut the circuit pattern inside the printed-circuit board.

The working rate R of the laser beam depend on the material onto which the laser beam is projected. The working rate R with respect to resin of an insulating body is two or three times as large as the working rate R with respect to metal (e.g., copper) of the circuit pattern. In view of complete cutting of the circuit pattern, as shown in FIG. 23A, the width of the projection area $E_{p0}$ of the laser beam used to work the printed-circuit board may be greater than the width of the circuit pattern 117 to be cut. In this case, since the working rate with respect to the circuit pattern 117 is smaller than that with respect to the resin of the insulating body, parts of the resin beside the circuit pattern 117 are removed sooner than the circuit pattern 117.

Figure 23B:
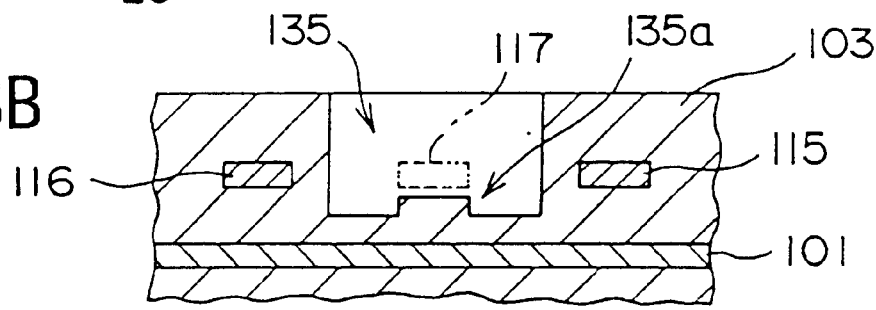

As a result, immediately after the circuit pattern 117 is cut, as shown in FIG. 23B, a protruding portion corresponding to the gap between cut ends of the circuit pattern 117 is formed on the bottom surface 135a of the worked hole 135. In an extreme case, before the circuit pattern 117 is completely cut, the circuit pattern 101 located under the circuit pattern 117 to be cut is corroded by the laser beam which passes through portions at the sides of the circuit patterns 117.

To eliminate the above disadvantage, the projection area of the laser beam is controlled as follows.

Figure 25:
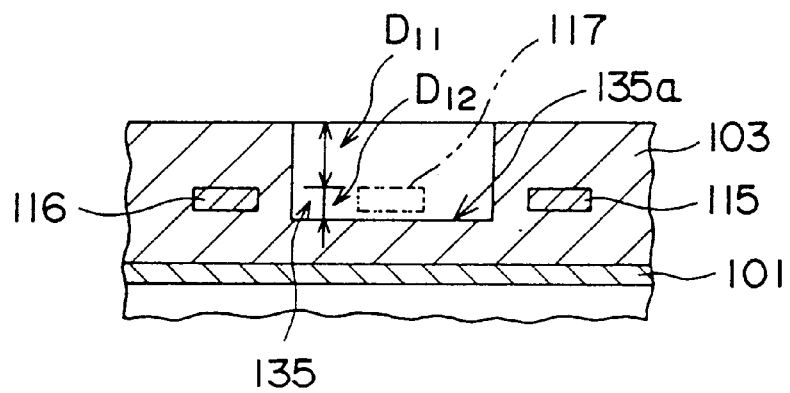
FIG. 25 is a cross sectional view illustrating the circuit pattern cut by the beam for which the mask is adjusted as shown in FIG. 24 (1st)

Until the surface of the circuit pattern 117 is exposed, the laser beam in which the mask thereof is adjusted so that the projection area $E_{p0}$ is obtained as shown in FIG. 23A is projected onto the printed-circuit board 100 at the working rate R based on the material of the insulating body 103. As a result, as shown in FIG. 25, a worked hole 135, having the depth of $D_{11}$, in which the bottom surface is flat is formed.

Figure 24A:
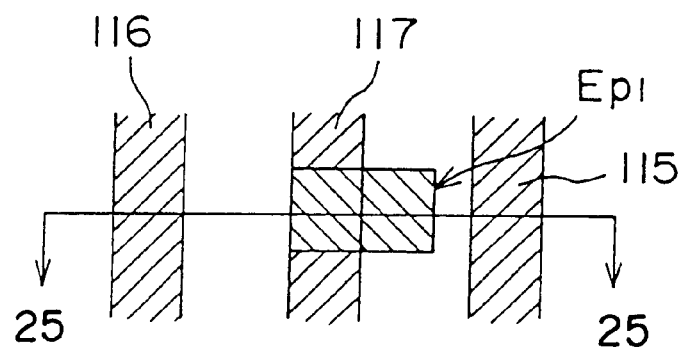
FIGS. 24 and 24B are diagrams illustrating a procedure for adjusting a mask for a beam used to cut the circuit pattern inside the printed-circuit board.

After this, as shown in FIG. 24A, the mask of the laser bean is adjusted so that the projection area $E_{p1}$ covering the circuit pattern 117 and only a portion at a first side of the circuit pattern 117 is obtained. In this state, the laser beam is further projected onto a predetermined number of times the bottom surface of the worked hole 135 at the working rate R with respect the resin of the insulating body 103.

Figure 24B:
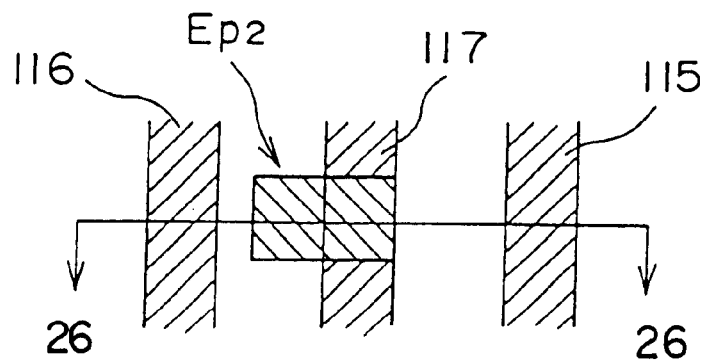

Next, as shown in FIG. 24B, the mask of the laser beam is adjusted so that the projection area $E_{p2}$ covering the circuit pattern 117 and only a portion at a second side of the circuit pattern 117 is obtained. In this state, the laser beam is further projected onto the bottom surface of the worked hole 135 a predetermined number of times at the working rate R.

After this, every time the laser beam is projected a predetermined number of times, the projection area is switched between $E_{p1}$ shown in FIG. 24A and $E_{p2}$ shown in FIG. 24B. The switching operation of the projection area is continuously performed until the circuit pattern 117 is completely cut. During the projection of the laser beam with the switching operation of the projection area, the depth of the worked hole 135 is increased by $D_{12}$.

According to the projection control of the laser beam, the laser beam is projected onto the circuit pattern 117 at a rate twice as large as a rate at which the laser beam is projected onto both the positions at the first and second sides of the circuit pattern 117. In a case where the working rate with respect to the resin of the insulating body 103 is twice as large as that with respect to the metal of the circuit pattern 117, when the circuit pattern 117 is completely cut, positions of worked surfaces corresponding to the circuit pattern 117 and the portions at the first and second sides of the circuit pattern 117 in the depth direction are theoretically the same as each other ($D_{11}+D_{12}$). As a result, the protruding portion as shown in FIG. 23B is not formed on the bottom surface 135a of the worked hole 135 which is formed to cut the circuit pattern 117. In addition, the circuit pattern 101 located under the circuit pattern 117 is prevented from being corroded by the laser beam before the circuit pattern 117 is completely cut.

In the above example, to change the projection area, the mask of the laser beam is changed. On the other hand, a relative position of the printed-circuit board to be worked with respect to the laser beam may be changed in a state where the mask of the laser beam is fixed.

Figure 26:
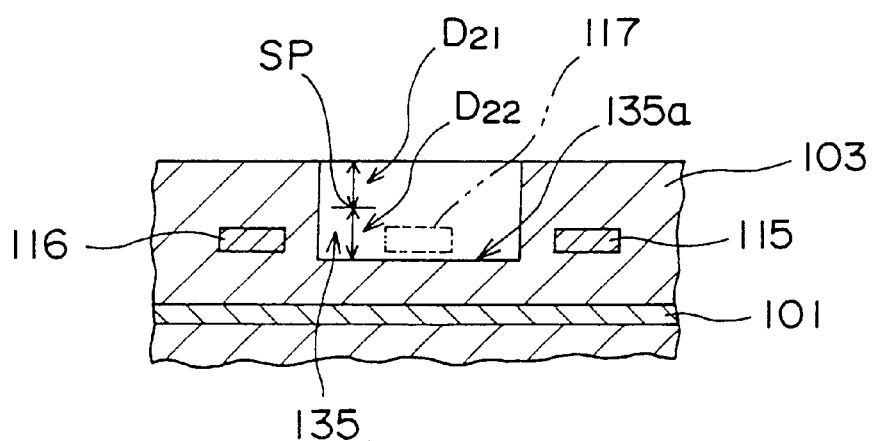
FIG. 26 is a cross sectional view illustrating the circuit pattern cut by the beam for which the mask is adjusted as shown in FIG. 24 (2nd)

Furthermore, in a case where the working rate with respect to the resin covering the circuit pattern 117 to be cut is greater than twice the working rate with respect to the circuit pattern 117, a time at which the projection area of the laser beam is switched is controlled based on the difference between the working rates. That is, a switching position SP at which the projection area of the laser beam is switched in the printed-circuit pattern is decided so that the bottom surface 135a of the worked hole 135 is substantially flat when the circuit pattern 117 is completely cut. As shown in FIG. 26, until the bottom surface of the worked hole 135 reaches the switching position SP (the depth of $D_{21}$), the printed-circuit board is worked by the laser beam having the projection area $E_{p0}$ which covers, as shown in FIG. 23, the circuit pattern 117 and the portions at both sides of the circuit pattern 117. After this, in a range between the switching position SP (the depth of $D_{21}$) and a position of the depth of $D_{22}$, the projection area $E_{p1}$ shown in FIG. 24A and the projection area $E_{p2}$ shown in FIG. 24B are alternately switched in the same manner as in the case described above.

As a result of the switching control of the projection area described above, even if the working rate with respect to the insulating body 103 covering the circuit pattern 117 to be cut is greater than twice the working rate with respect to the circuit pattern 117, the bottom surface 135a of the worked hole 135 can be flat when the circuit pattern 117 is completely cut.

In the cases, as described above, where the circuit pattern is cut by using the high energy beam such as the laser beam or the electron beam in the non-contacting manner, the metal powder caused by the abrasion of the circuit pattern is adhered to the inner surface of the worked hole. As a result, the isolation between the cut ends of the circuit pattern may not be sufficiently maintained.

Figure 27A:
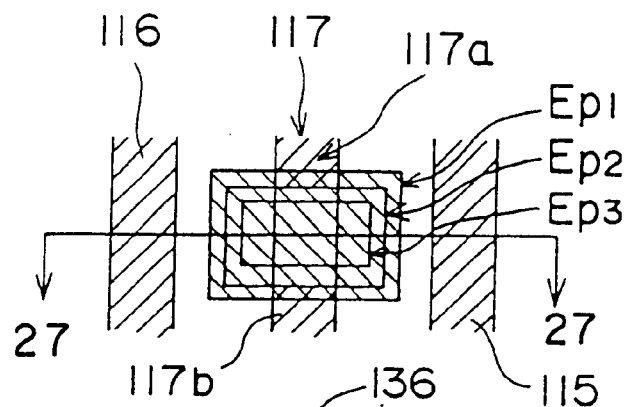
FIGS. 27A and 27B are diagrams illustrating another example of a masking adjustment for the beam used to cut the circuit pattern inside the printed-circuit board and a cross sectional structure of a hole formed of the beam.
Figure 27B:
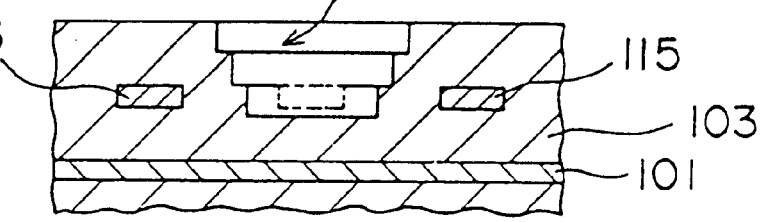

To prevent such the matter, the projection area of the high energy beam such as the laser beam or the electron beam is controlled as follows. In a case where the circuit pattern in a layer inside the printed-circuit board is cut by using the excimer laser, as shown in FIG. 27A, the work starts using the laser beam having the projection area $E_{p1}$ which is greater than the projection area $E_{p3}$ used to finally cut the circuit pattern 117. The phased adjustment of the mask of the laser beam is performed so that every time the laser beam is projected a constant number of times, the projection area is narrowed ($E_{p1} \rightarrow E_{p2}$). Finally, the circuit pattern 117 is cut by using the laser beam having the projection area $E_{p3}$, so that the circuit pattern 117 is divided into pattern parts 117a and 117b. According to the phased control of the projection area as described above, the worked hole 136 is, as shown in FIG. 27B, narrowed by stages. In this state, the metal powder caused by cutting of the circuit pattern 117 may be adhered to the inner surface of the worked hole 136.

Figure 28A:
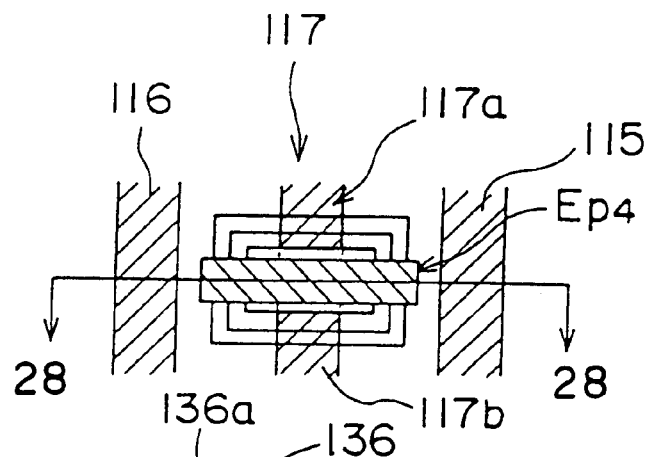
FIGS. 28A and 28B are diagrams illustrating a mask for a beam used to remove metal powder from the hole formed to cut the circuit pattern as shown in FIGS. 27A and 27B and a cross sectional structure of the hole from which the metal powder is removed.
Figure 28B:
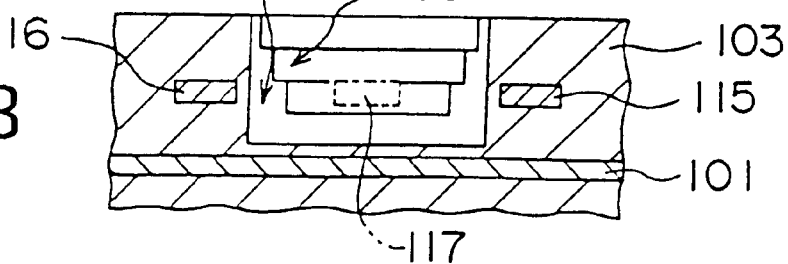

Next, the mask of the laser beam is adjusted so that the width of the projection area $E_{p4}$ is slightly greater than the width of the projection area $V_{p1}$ controlled at the start of the work, as shown in FIG. 28A. The laser beam having the projection area $E_{p4}$ is then projected onto an area between the pattern parts 117a and 117b a predetermined number of times. Due to the work using the laser beam with the projection area $E_{p4}$, as shown in FIG. 28B, a slot 136a deeper than the worked hole 136 which had been formed is formed. The worked hole 135 is divided into a pattern part 117a side portion and a pattern part 117b side portion by the slot 136a.

The worked hole 136 formed to cut the circuit pattern 117 is divided by the slot 136a. While the slot 136a is being formed, the metal powder adhered to the inner surface of the worked hole 136 is removed. As a result, there may be no metal powder inside the slot 136a. Thus, the insulation between the pattern parts 117a and 117b (the cut ends of the circuit pattern 117) is prevented from deterioration.

The projection area of the laser beam may be continuously changed instead of the phased change of the projection area described above.

Figure 29A:
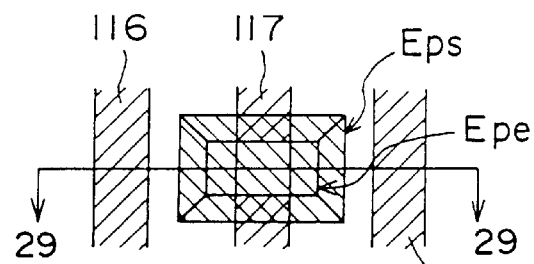
FIGS. 29A and 29B are diagrams illustrating another example of a masking adjustment for the beam used to cut the circuit pattern inside the printed-circuit board and a cross sectional structure of a hole formed of the beam.
Figure 29B:
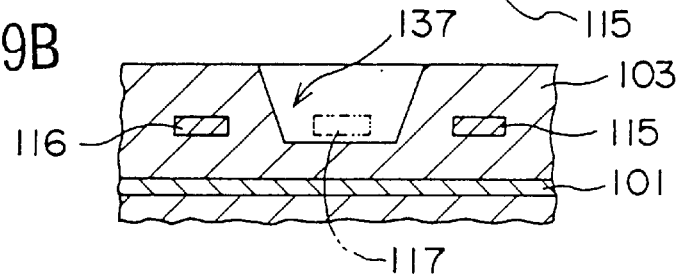

In this case, the work starts using the laser beam with the projection area $E_{ps}$ greater than the projection area $E_{pe}$ finally used to cut the circuit pattern 117. After this, as shown in FIG. 29A, the mask of the laser beam is adjusted so that the projection area is gradually narrowed in proportion to the number of projections of the laser beam. Finally, the circuit pattern 117 is cut using the laser beam with the projection area $E_{pe}$, and the circuit pattern 117 is divided into the pattern parts 117a and 117b. Due to the continuous control of the projection area, as shown in FIG. 29B, the worked hole 137 is gradually narrowed.

In the above case, while the worked hole 137 is being worked, the laser beam is continually projected onto the inner surface of the worked hole 137. Thus, the metal powder generated when the circuit pattern 117 is cut is immediately removed by the laser beam. As a result, the insulation between the pattern parts 117a and 117b can be improved.

To further improve the insulation between the pattern parts 117a and 117b, after the pattern 117 is cut by the worked hole 137 formed as described above, the projection of the laser beam is performed again as follows.

Figure 30A:
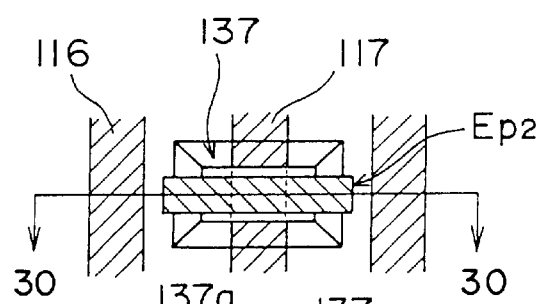
FIGS. 30A and 30B are diagrams illustrating a mask for a beam used to remove metal powder from the hole formed to cut the circuit pattern as shown in FIGS. 29A and 29B and a cross sectional structure of the hole from which the metal powder is removed.
Figure 30B:
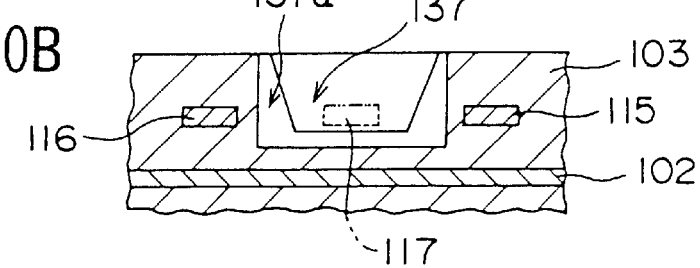

The mask of the laser beam is adjusted again so that the width of the projection area $E_{p2}$ is slightly greater than the width of the projection area $E_{ps}$ controlled at the start of the work, as shown in FIG. 30A. The laser beam having the projection area $E_{p2}$ is then projected onto an area between the pattern parts 117a and 117b a predetermined number of times. Due to the work using the laser beam with the projection area $E_{p2}$, as show in FIG. 30B, a slot 137a deeper than the worked hole 137 which has been formed is formed. The worked hole 137 is divided into a pattern part 117a side portion and a pattern part 117b side portion by the slot 137a.

Thus, even if the metal powder is adhered to the inner surface of the worked hole 137, the worked hole 137 formed to cut the circuit pattern 117 is divided and the metal powder is removed from the inner surface of the slot 137a. As a result, the insulation between the pattern parts 117a and 117b is prevented from deteriorating by the powder adhered to the inner surface of the worked hole 137.

In a case where circuit patterns are altered, a new circuit path is generally formed between electronic parts by using a wire. For example, in the case of alteration of the circuit pattern as shown in FIGS. 1A, 1B, 1C and 1D, the wire 30 connects the exposed circuit patterns to each other. If the location of the wire 30 is limited in the printed-circuit board, a path for electrical connection between two portions is formed in the printed-circuit board as follows.

Figure 31:
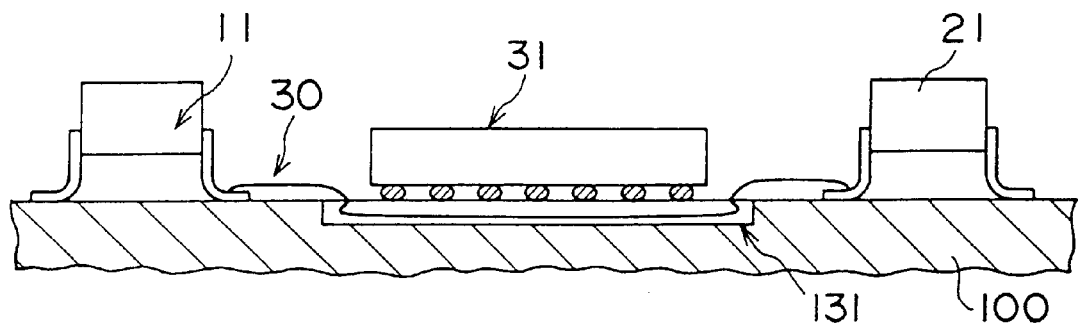
FIG. 31 is a diagram illustrating a structure by which a circuit wire passes under circuit elements mounted on the printed-circuit board.

As shown in FIG. 31, semiconductor devices 11 and 21 (e.g, LSIs) which are to be electrically connected are mounted on the printed-circuit board 100. A semiconductor device 31 (e.g., LSI) which is located between the semiconductor devices 11 and 21 is closely mounted on the printed-circuit board 100. A groove 131 is formed on the printed-circuit board 100 under the semiconductor 31 by using the laser beam or the electron beam. A wire 30 is placed in the groove 131. Ends of the wire 30 are connected to predetermined pins of the semiconductor device 11 and 21 with solder.

Thus, the wire used for the alteration of the circuit pattern can be placed inside the printed-circuit board.

Figure 32:
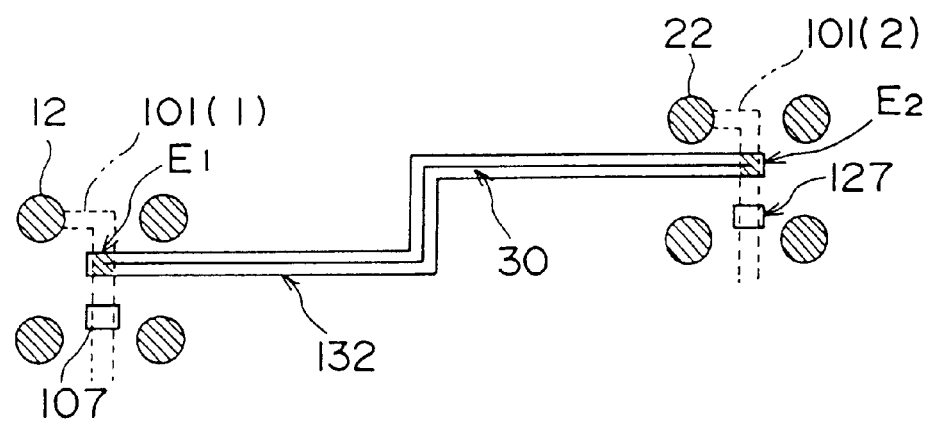
FIG. 32 is a plan view illustrating a groove in which a circuit wire connecting circuit patterns exposed from the printed-circuit board is placed.

As shown in FIG. 32, circuit patterns 101(1) and 101(2) which are inside the printed-circuit board and respectively connected to pins 12 and 22 of semiconductor devices are respectively cut by worked holes 107 and 127. A groove 132 is formed, by using the laser beam, on the printed-circuit board between the circuit pattern 100(1) connected with the pin 12 and the circuit pattern 100(2) connected with the pin 22. At the ends $E_1$ and $E_2$ of the groove 132, the circuit patterns 100(1) and 100(2) are partially exposed. The wire 30 is placed in the groove 132. The ends of the wire 30 are respectively connected to the exposed portions of the circuit patterns 100(1) and 100(2) with solder.

Figure 33:
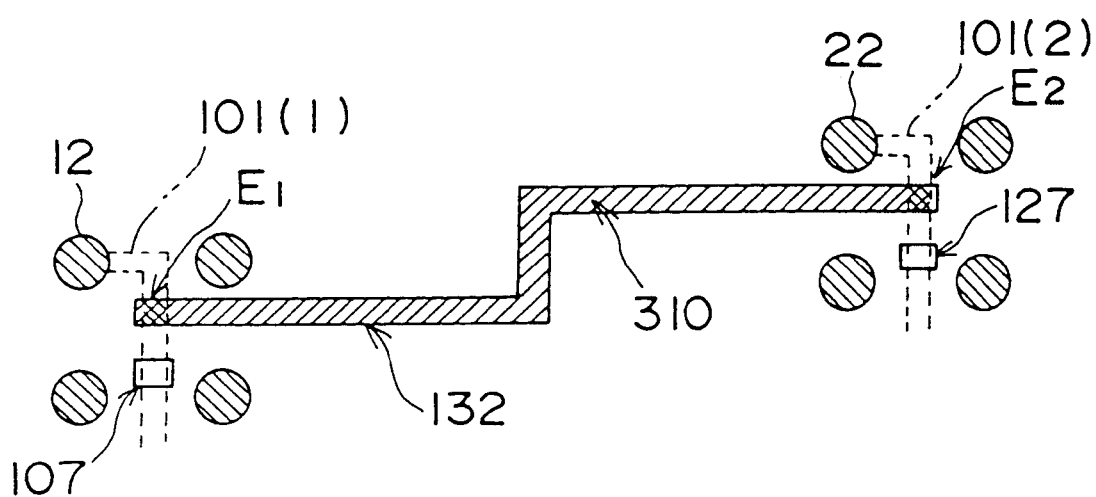
FIG. 33 is a plan view illustrating a groove which is filled with conductive material connecting circuit patterns exposed from the printed-circuit board.

In addition, as shown in FIG. 33, the groove 132 formed in the same manner as in the above case is filled with conductive material 310, such as solder paste, solder wire, solder ribbon, solder balls or conductive adhesive. The whole printed-circuit or the groove is heated so that the conductive material 310 is melted and subsequently hardened. As a result, the circuit patterns 100(1) and 100(2) which are partially exposed at the ends $E_1$ and $E_2$ of the groove 132 are electrically connected by the conductive material 310 filling the groove 132.

The wire 30 and the conductive material 310 provided in the groove 132 formed on the printed-circuit board are fixed in the groove 132, insulated and protected as follows.

As shown in FIG. 34A, the inner surface of the groove 132 is coated with fixing material 311, such as adhesive, coating material or potting material. While the fixing material 311 is heated, the wire is placed in the groove 132. As a result, as shown in FIG. 34B, the wire 30 can be fixed, insulated and protected by the fixing material 311 (the adhesive, coating material or potting material).

Furthermore, after the wire 30 or the conductive material (e.g., the solder, the conductive adhesive or the like) is provided in the groove 132, the groove 132 may be filled with the fixing material 311 (the adhesive, the coating material or the potting material). The fixing material filling the groove 132 is then hardened. In this case also, the wire 30 or the conductive material can be fixed, insulated and protected by the fixing material as shown in FIG. 34B.

In addition, the wire 30 can be fixed in the groove 132 formed on the printed-circuit board as follows.

As shown in FIG. 35A, the wire 30 which is coated with fusion material 312 is placed in the groove 132 formed in the printed-circuit board 100. The fusion material 312 reveals adhesiveness when the fusion material 312 is heated or is provided with solvent. After the wire 30 is placed in the groove 132, the wire 30 is heated or provided with the solvent. The fusion material 312 is thus softened and the wire 30 is fixed in the groove 132 by the fusion material 312.

The present invention is not limited to the aforementioned embodiments, and other variations and modifications may be made without departing from the scope of the claimed invention.

What is claimed is:

1. A method for alternating a circuit pattern of a printed-circuit board, comprising the steps of:

(a) removing a portion of said printed-circuit board so that said circuit pattern inside said printed-circuit board is exposed; and (b) connecting an exposed portion of said circuit pattern obtained in step (a) to another portion of said printed-circuit board by a conductive body so that a circuit path is formed between said exposed portion of said circuit pattern and said another portion of said printed-circuit board, wherein said printed-circuit board is provided with a sheet-shaped circuit pattern located over said circuit pattern, and wherein said step (a) comprises the steps of:

(a-1) forming a first hole which passes through said sheet-shaped circuit pattern, said first hole having a first diameter;

(a-2) filling said first hole with insulating material; and (a-3) forming a second hole which expands from a surface of the insulating material to a surface of said circuit patterns so that said circuit pattern is exposed, said second hole having a second diameter which is smaller than the first diameter.

2. A method of altering a circuit pattern of a printed-circuit board, comprising the steps of:

(a) removing a portion of said printed-circuit board so that said circuit pattern inside said printed-circuit is exposed; and (b) connecting an exposed portion of said circuit pattern obtained in step (a) to another portion of said printed-circuit board by a conductor body so that a circuit path is formed between said exposed portion of said circuit pattern and said another portion of said printed-circuit board, wherein, said conductor body connecting said exposed portion of said circuit patterns and said another portion of said printed-circuit board is a wire.

3. The method as claimed in claim 2, wherein said step (b) comprises the steps of:

(b-1) providing a conductive material on said exposed portion of said circuit pattern, said conductive material being softened by heat; and (b-2) inserting an end portion of said wire into said conductive material while said conductive material is being heated so that said wire is connected to said exposed portion of said circuit pattern via said conductive material.

4. The method as claimed in claim 2, wherein said step (b) comprises the steps of:
  (b-1) adhering a predetermined amount of conductive material to an end portion of said wire, said conductive material being softened by heat; and
  (b-2) heating said wire in a state where said end portion with the predetermined amount of said conductive material is in contact with said exposed portion of said circuit pattern so that said wire is connected to said exposed portion of said circuit pattern via said conductive material.

5. A method of altering a circuit pattern of a printed-circuit board, comprising the step of:
  (a) removing a portion of said printed-circuit board so that said circuit pattern inside said printed-circuit board is exposed; and
  (b) connecting an exposed portion of said circuit pattern obtained in step (a) to another portion of said printed-circuit board by a conductive body so that a circuit path is formed between said exposed portion of said circuit pattern and said another portion of said printed-circuit board,
  wherein said printed-circuit board is provided with a sheet-shaped circuit pattern located over said circuit pattern, and wherein said step (a) comprises the steps of:
  (a-1) forming a first hole which passes through said sheet-shaped circuit pattern, said first hole having a first rectangular cross section; and
  (a-2) forming a second hole which expands from a bottom surface of said first hole to a surface of said circuit patterns so that said circuit pattern is exposed, said second hole having a second rectangular cross section which is smaller than the first rectangular cross section.

6. A method of altering a circuit pattern of a printed-circuit board, comprising the steps of:
  (a) removing a portion of said printed-circuit board so that said circuit pattern inside said printed-circuit board is exposed; and
  (b) connecting an exposed portion of said circuit pattern obtained in step (a) to another portion of said printed-circuit board by a conductive body so that a circuit path is formed between said exposed portion of said circuit pattern and said another portion of said printed-circuit board,
  wherein said printed-circuit board is provided with a sheet-shaped circuit pattern located over said circuit pattern, and wherein said step (a) comprises the steps of:
  (a-1) forming a first hole which passes through said sheet-shaped circuit pattern, said first hole having a first rectangular cross section;
  (a-2) filling said first hole with insulating material; and
  (a-3) forming a second hole which expands from a surface of the insulating material to a surface of said circuit patterns so that said circuit pattern is exposed, said second hole having a second rectangular cross section which is smaller than the first rectangular cross section.

7. A method for cutting a circuit pattern located under a sheet-shaped circuit pattern inside a printed-circuit board via an insulating, said method comprising the steps of:
  (a) forming a first cutting hole which passes through said sheet-shaped circuit and passing halfway through the insulating layer, said first cutting hole having a first rectangular cross section; and
  (b) forming a second cutting hole which expands from a bottom surface of said first cutting hole and passes through said circuit pattern and the insulting layer so that said circuit pattern is cut and a step part of the insulating layer is formed by a junction of the first and second cutting holes, said second cutting hole having a second rectangular cross section which is smaller than the first rectangular cross section, said step of forming said second cutting hole being provided for the purpose of preventing electric insulation between the sheet-shaped circuit pattern and the circuit pattern located under said sheet-shaped circuit pattern from being degraded.

8. A method for altering a circuit pattern of a printed-circuit board comprising the steps of:
  (a) removing a portion of said circuit pattern so that said circuit pattern inside said printed-circuit board is exposed; and
  (b) connecting an exposed portion of said circuit pattern obtained in said step (a) to another exposed portion of said circuit pattern obtained in said step (a) by a conductive body separated from the circuit pattern so that a circuit path is formed between said exposed portion of said circuit pattern and said another exposed portion of said circuit pattern.

9. The method as claimed in claim 8, wherein said printed-circuit board is provided with a sheet-shaped circuit pattern located over said circuit pattern, and wherein said step (a) comprises the steps of:
  (a-1) forming a first hole which passes through said sheet-shaped circuit pattern said first hole having a first diameter; and
  (a-2) forming a second hole which expands from a bottom surface of said first hole to a surface of said circuit pattern so that said circuit pattern is exposed, said second hole having a second diameter which is smaller than the first diameter.

10. A method for cutting a circuit pattern located under a sheet-shaped circuit pattern inside a printed-circuit board via an insulating layer, said method comprising the steps of:
  (a) forming a first cutting hole which passes through said sheet-shaped circuit and passing halfway through the insulating layer so that said circuit pattern inside said circuit board is exposed;
  (b) forming a second cutting hole which expands from a bottom surface of said first cutting hole and passes through said circuit pattern and the insulating layer so that said circuit pattern is cut and a step part of the insulating layer is formed by a junction of the first and second cutting holes, said second cutting hole having a cross section which is smaller than the first cutting hole; and
  (c) connecting an exposed portion of said circuit pattern obtained in said step (a) to another exposed portion of said circuit pattern obtained in said step (b) by a conductive body separated from the circuit pattern so that a circuit path is formed between said exposed portion of said circuit pattern and said another exposed portion of said circuit pattern.

* * * * *